(12) United States Patent
Chen et al.

(10) Patent No.: US 11,114,413 B2
(45) Date of Patent: Sep. 7, 2021

(54) STACKING STRUCTURE, PACKAGE STRUCTURE AND METHOD OF FABRICATING THE SAME

(71) Applicant: Taiwan Semiconductor Manufacturing Co., Ltd., Hsinchu (TW)

(72) Inventors: Ming-Fa Chen, Taichung (TW); Sung-Feng Yeh, Taipei (TW); Tzuan-Horng Liu, Taoyuan (TW); Chao-Wen Shih, Hsinchu County (TW)

(73) Assignee: Taiwan Semiconductor Manufacturing Company, Ltd., Hsinchu (TW)

( * ) Notice: Subject to any disclaimer, the term of this patent is extended or adjusted under 35 U.S.C. 154(b) by 58 days.

(21) Appl. No.: 16/581,795

(22) Filed: Sep. 25, 2019

(65) Prior Publication Data
US 2020/0411476 A1 Dec. 31, 2020

Related U.S. Application Data

(60) Provisional application No. 62/867,241, filed on Jun. 27, 2019.

(51) Int. Cl.
*H01L 25/065* (2006.01)
*H01L 23/31* (2006.01)
(Continued)

(52) U.S. Cl.
CPC ........ *H01L 25/0657* (2013.01); *H01L 21/561* (2013.01); *H01L 21/568* (2013.01); *H01L 21/6835* (2013.01); *H01L 21/78* (2013.01); *H01L 23/3128* (2013.01); *H01L 23/49816* (2013.01); *H01L 23/49838* (2013.01); *H01L 24/05* (2013.01); *H01L 24/08* (2013.01); *H01L 24/32* (2013.01); *H01L 24/33* (2013.01); *H01L 24/48* (2013.01); *H01L 24/73* (2013.01); *H01L 24/83* (2013.01); *H01L 24/85* (2013.01); *H01L 24/89* (2013.01); *H01L 24/92* (2013.01); *H01L 24/97* (2013.01); *H01L 25/18* (2013.01); *H01L 25/50* (2013.01); *H01L 2221/68327* (2013.01); *H01L 2221/68359* (2013.01); *H01L 2221/68372* (2013.01); *H01L 2224/08147* (2013.01);
(Continued)

(58) Field of Classification Search
None
See application file for complete search history.

(56) References Cited

U.S. PATENT DOCUMENTS 8,802,504 B1 8/2014 Hou et al.
8,803,292 B2 8/2014 Chen et al.
(Continued)

*Primary Examiner* — Nduka E Ojeh
(74) *Attorney, Agent, or Firm* — JCIPRNET

(57) ABSTRACT

A package structure includes a plurality of stacked die units and an insulating encapsulant. The plurality of stacked die units is stacked on top of one another, where each of the plurality of stacked die units include a first semiconductor die, a first bonding chip. The first semiconductor die has a plurality of first bonding pads. The first bonding chip is stacked on the first semiconductor die and has a plurality of first bonding structure. The plurality of first bonding structures is bonded to the plurality of first bonding pads through hybrid bonding. The insulating encapsulant is encapsulating the plurality of stacked die units.

20 Claims, 20 Drawing Sheets

(51) Int. Cl.
*H01L 23/00* (2006.01)
*H01L 23/498* (2006.01)
*H01L 25/18* (2006.01)
*H01L 25/00* (2006.01)
*H01L 21/78* (2006.01)
*H01L 21/56* (2006.01)
*H01L 21/683* (2006.01)

(52) U.S. Cl.
CPC ............ *H01L 2224/32145* (2013.01); *H01L 2224/32225* (2013.01); *H01L 2224/33181* (2013.01); *H01L 2224/48091* (2013.01); *H01L 2224/48106* (2013.01); *H01L 2224/48228* (2013.01); *H01L 2224/73215* (2013.01); *H01L 2224/73265* (2013.01); *H01L 2224/80006* (2013.01); *H01L 2224/80895* (2013.01); *H01L 2224/80896* (2013.01); *H01L 2224/83005* (2013.01); *H01L 2224/85005* (2013.01); *H01L 2224/92247* (2013.01); *H01L 2224/95001* (2013.01); *H01L 2225/0651* (2013.01); *H01L 2225/06527* (2013.01); *H01L 2225/06562* (2013.01); *H01L 2225/06586* (2013.01); *H01L 2225/06593* (2013.01)

(56) References Cited

U.S. PATENT DOCUMENTS

| | | | |
|---|---|---|---|
| 8,803,316 | B2 | 8/2014 | Lin et al. |
| 8,993,380 | B2 | 3/2015 | Hou et al. |
| 9,281,254 | B2 | 3/2016 | Yu et al. |
| 9,299,649 | B2 | 3/2016 | Chiu et al. |
| 9,372,206 | B2 | 6/2016 | Wu et al. |
| 9,425,126 | B2 | 8/2016 | Kuo et al. |
| 9,443,783 | B2 | 9/2016 | Lin et al. |
| 9,496,189 | B2 | 11/2016 | Yu et al. |
| 2008/0176358 | A1* | 7/2008 | Liu .................. H01L 24/32 438/109 |
| 2015/0279825 | A1* | 10/2015 | Kang ............... H01L 21/76898 257/48 |
| 2017/0345761 | A1* | 11/2017 | Yu ..................... H01L 21/4857 |
| 2018/0145053 | A1* | 5/2018 | Jung .................. H01L 24/06 |
| 2020/0135684 | A1* | 4/2020 | Kim ................... H01L 23/3107 |

* cited by examiner

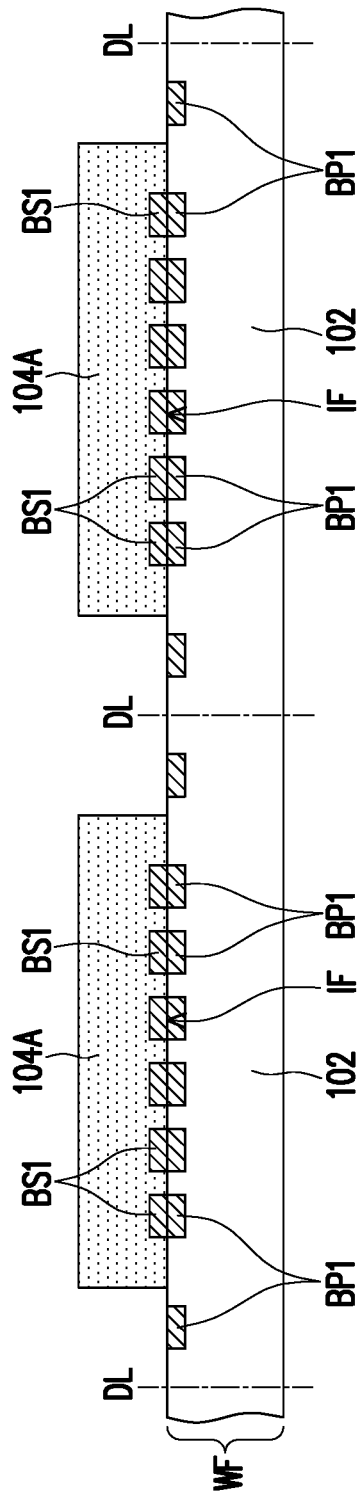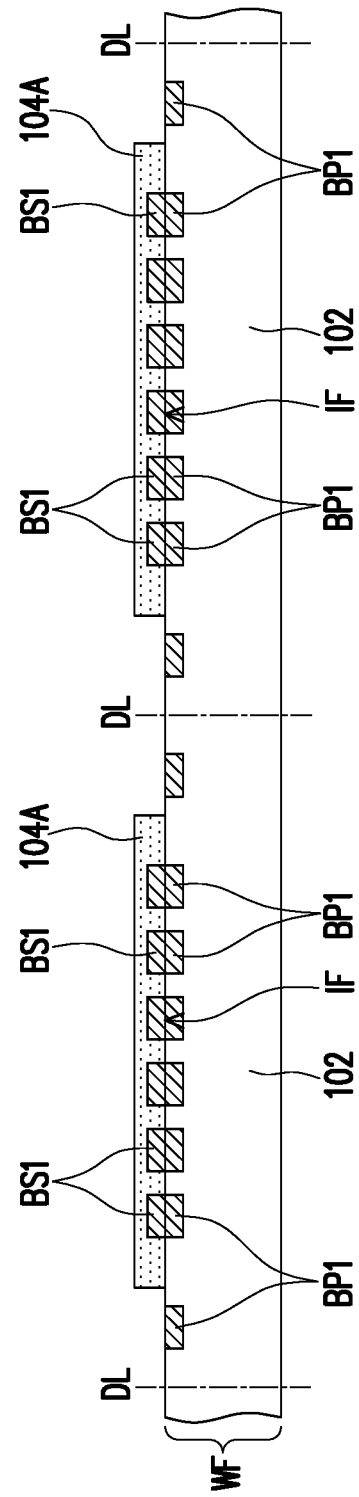
FIG. 1A
FIG. 1B

STACKING STRUCTURE, PACKAGE STRUCTURE AND METHOD OF FABRICATING THE SAME

CROSS-REFERENCE TO RELATED APPLICATION

This application claims the priority benefit of U.S. provisional application Ser. No. 62/867,241, filed on Jun. 27, 2019. The entirety of the above-mentioned patent application is hereby incorporated by reference herein and made a part of this specification.

BACKGROUND

High-density integration of diverse components such as microprocessors, memory, optoelectronics, mixed signal circuits and microelectromechanical systems is a challenging task. One possible solution for high-density integration is three-dimensional stacking, also called three-dimensional integration, of different microelectronic components at the wafer level. The three-dimensional stacking structures offer numerous advantages, including higher density of interconnects, decreased length of interconnects and packaging size or volume reduction.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the critical dimensions of the various features may be arbitrarily increased or reduced for clarity of discussion.

FIG. 1A to FIG. 1E are schematic sectional views of various stages in a method of fabricating a stacked die unit according to some exemplary embodiments of the present disclosure.

DETAILED DESCRIPTION

Figure 1C:
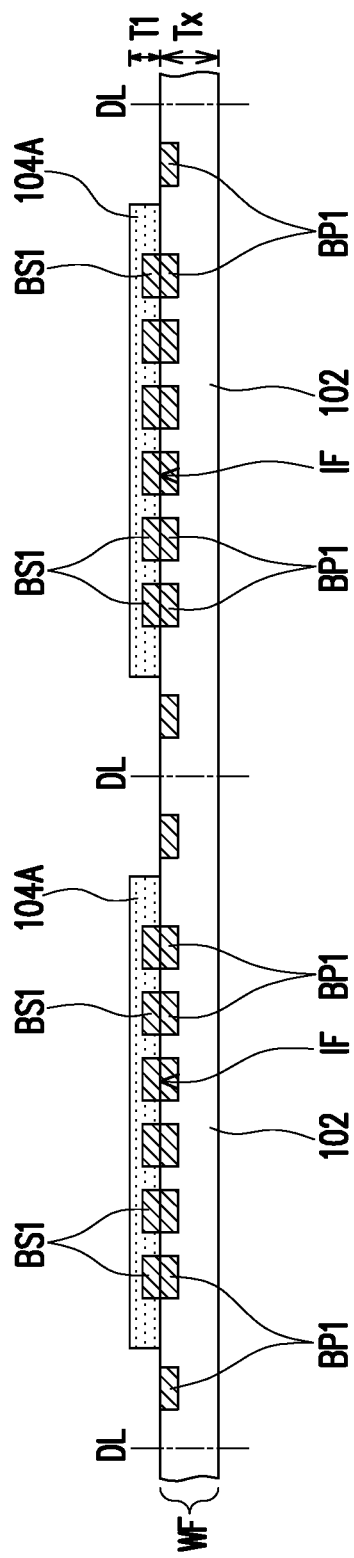

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a second feature over or on a first feature in the description that follows may include embodiments in which the second and first features are formed in direct contact, and may also include embodiments in which additional features may be formed between the second and first features, such that the second and first features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath", "below", "lower", "on", "over", "overlying", "above", "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

Other features and processes may also be included. For example, testing structures may be included to aid in the verification testing of the 3D packaging or 3DIC devices. The testing structures may include, for example, test pads formed in a redistribution layer or on a substrate that allows the testing of the 3D packaging or 3DIC, the use of probes and/or probe cards, and the like. The verification testing may be performed on intermediate structures as well as the final structure. Additionally, the structures and methods disclosed herein may be used in conjunction with testing methodologies that incorporate intermediate verification of known good dies to increase the yield and decrease costs.

FIG. 1A to FIG. 1E are schematic sectional views of various stages in a method of fabricating a stacked die unit according to some exemplary embodiments of the present disclosure. Referring to FIG. 1A, a semiconductor wafer WF having a plurality of first semiconductor dies 102 (or base semiconductor die) is provided. In some embodiments, each of the first semiconductor dies 102 (base semiconductor dies) includes a plurality of first bonding pads BP1. The first bonding pads BP1 are embedded in dielectric materials (not shown) of the first semiconductor dies 102, while a portion of the first bonding pads BP1 is revealed at a surface of the first semiconductor dies 102.

In certain embodiments, a plurality of first bonding chips 104A (controller chip) is stacked on the semiconductor wafer WF on each of the first semiconductor dies 102. As illustrated in FIG. 1A, each of the first bonding chips 104A (controller chip) has a plurality of first bonding structures BS1. The first bonding structures BS1 are embedded in dielectric materials (not shown) of the first bonding chips 104A, while a portion of the first bonding structures BS1 is revealed at a surface of the first bonding chips 104A. In some embodiments, the first bonding structures BS1 are bonded to the first bonding pads BP1 by hybrid bonding (through a hybrid bonding interface IF). In certain embodiments, the first bonding chips 104A (controller chips) are stacked on the first semiconductor dies 102 (base semiconductor die) in a way that the first bonding pads BP1 faces the first bonding structures BS1 so that they are physically bonded or joined with one another at the hybrid bonding interface IF. In some embodiments, the dimensions of the first bonding chips 104A are smaller than that of the first semiconductor dies 102. In some embodiments, the first semiconductor dies 102 (or base semiconductor die) are memory dies, whereas the first bonding chips 104A (controller chip) are controller chips used for logic control.

In some embodiments, the first bonding pads BP1 and the first bonding structures BS1 are made of conductive materials. In certain embodiments, the first bonding pads BP1 and the first bonding structures BS1 are made of copper, copper alloys, or other suitable metallic materials. The type of metallic material used is not limited in the disclosure, and the material may be appropriately selected so that the hybrid bonding between the first bonding pads BP1 and the first bonding structures BS1 may be sufficiently achieved. In some embodiments, the first bonding pads BP1 and the first bonding structures BS1 are made of the same type of conductive materials. In alternative embodiments, the first bonding pads BP1 and the first bonding structures BS1 are made of different conductive materials.

Referring to FIG. 1B, a first thinning step is performed to reduce a thickness of the first bonding chips 104A. In some embodiments, the first bonding chips 104A are thinned down on a side opposite to where the first bonding structures BS1 are located. In one embodiment, the first bonding chips 104A may originally have a thickness of 600 μm to 780 μm, whereas the first thinning step reduces the thickness of the first bonding chips 104A to around 5 μm to 100 μm. However, the disclosure is not limited thereto. In some other embodiments, the thickness of the first bonding chips 104A is reduced to less than 20% of its original thickness. In alternative embodiments, the thickness of the first bonding chips 104A may be appropriately adjusted based on design requirements.

Referring to FIG. 1C, in a next step, a second thinning step is performed to reduce a thickness of the first semiconductor dies 102. In some embodiments, the first semiconductor dies 102 are thinned down on a side opposite to where the first bonding pads BP1 are located. In one embodiment, the first semiconductor dies 102 may originally have a thickness of 600 μm to 780 μm, whereas the second thinning step reduces the thickness of the first semiconductor dies 102 to around 5 μm to 100 μm. However, the disclosure is not limited thereto. In some other embodiments, the thickness of the first semiconductor dies 102 is reduced to less than 20% of its original thickness. In alternative embodiments, the thickness of the first semiconductor dies 102 may be appropriately adjusted based on design requirements.

After performing the first thinning step and the second thinning step, the resulting first bonding chips 104A may have a thickness of T1, whereas the first semiconductor dies 102 may have a thickness of Tx. In some embodiments, the thickness T1 of the first bonding chips 104A is smaller than the thickness Tx of the first semiconductor dies 102. However, the disclosure is not limited thereto. In alternative embodiments, the thickness T1 of the first bonding chips 104A is greater than the thickness Tx of the first semiconductor dies 102. In certain embodiments, a ratio of the thickness Tx to the thickness T1 (Tx:T1) is in a range of 1:5 to 10:1.

Figure 1D:
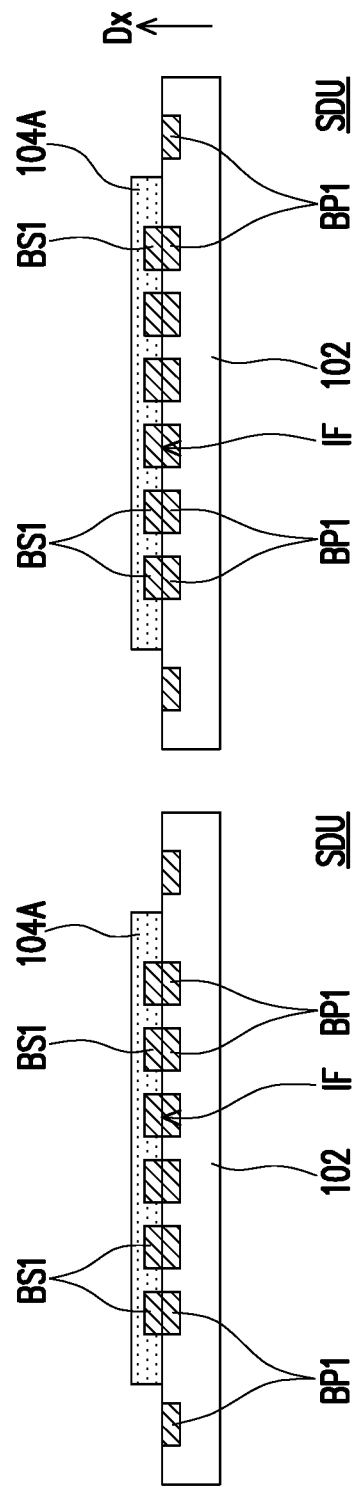

Referring to FIG. 1D, after the first and second thinning steps, dicing of the semiconductor wafer WF is performed along the dicing line DL (shown in FIGS. 1A to 1C) to form a plurality of stacked die units SDU. In some embodiments, the dicing is performed to cut through the first semiconductor dies 102 so as to separate each of the first semiconductor dies 102 from one another, and to form the plurality of stacked die units SDU. After the dicing process, each of the formed stacked die units SDU includes at least one first bonding chip 104A (controller chip) stacked over one first semiconductor die 102 (base semiconductor die) in a build-up direction Dx.

Figure 1E:
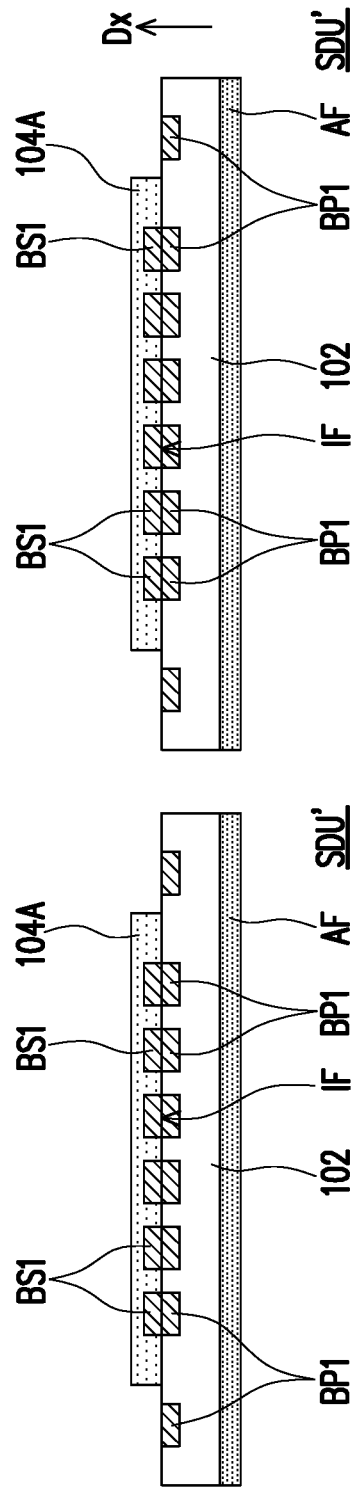

Referring to FIG. 1E, in some embodiments, an adhesive layer AF may be optionally formed on a backside of each of the first semiconductor dies 102 to form the stacked die units SDU'. In some embodiments, the adhesive layer AF is located on the first semiconductor die 102 on a side opposite to where the first bonding chip 104A is located. In certain embodiments, the first semiconductor die 102 is located over the adhesive layer AL, and the first bonding chip 104A is located over the first semiconductor die 102 along the build-up direction Dx.

Figure 2:
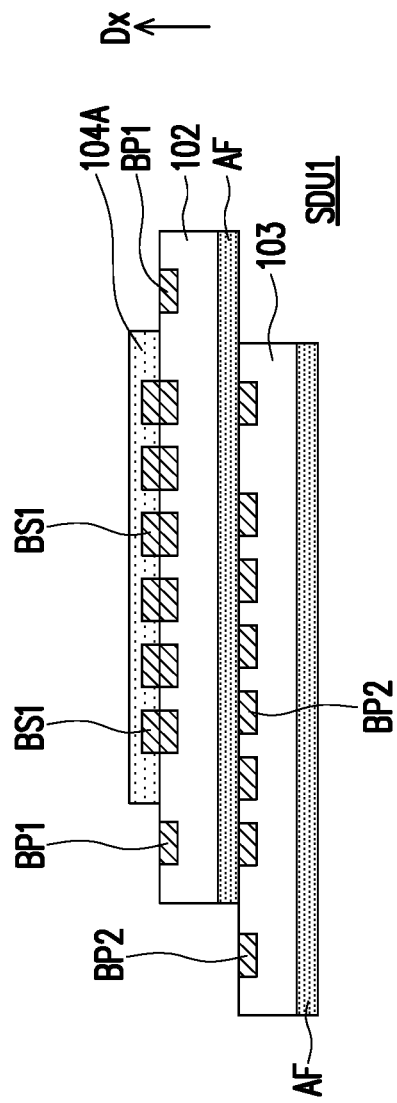
FIG. 2 is a schematic sectional view of a stacked die unit according to some other exemplary embodiments of the present disclosure.

FIG. 2 is a schematic sectional view of a stacked die unit according to some other exemplary embodiments of the present disclosure. The stacked die unit SDU1 illustrated in FIG. 2 is similar to the stacked die unit SDU' illustrated in FIG. 1E. Therefore, the same reference numerals are used to refer to the same or liked parts, and its detailed description will be omitted herein. As illustrated in FIG. 2, in some embodiments, a second semiconductor die 103 may be further included as part of the stacked die unit SDU1. For example, the stacked die unit SDU1 further includes the second semiconductor die 103 having a plurality of second bonding pads BP2. The second bonding pads BP2 are embedded in dielectric materials (not shown) of the second semiconductor die 103, while a portion of the second bonding pads BP2 is revealed at a surface of the second semiconductor die 103.

In some embodiments, the second semiconductor die 103 is attached to a backside of the first semiconductor die 102 on a side opposite to where the first bonding chip 104A is located. In some embodiments, the first semiconductor die 102 is attached to the second semiconductor die 103 through an adhesive layer AF. Furthermore, another adhesive layer AF may be located on a backside of the second semiconductor die 103, which allows the stacked die unit SDU1 to be attached to other components. In some embodiments, the second semiconductor die 103 is located on the adhesive layer AF, another adhesive layer AF is located on the second semiconductor die 103, the first semiconductor die 102 is located on the adhesive layer AF, and the first bonding chip 104A is located on the first semiconductor die 102, and these components are stacked in sequence along the build-up direction Dx. In some embodiments, the first semiconductor die 102 is attached to the second semiconductor die 103 through the adhesive layer AF in a way that a portion of the second bonding pads BP2 is covered by the adhesive layer AF, while a portion of the second bonding pads BP2 is revealed. In certain embodiments, the first bonding chip 104A is attached to some of the first bonding pads BP1 of the first semiconductor die 102 through hybrid bonding, while a portion of the first bonding pads BP1 are revealed by the first bonding chip 104A.

Figure 3:
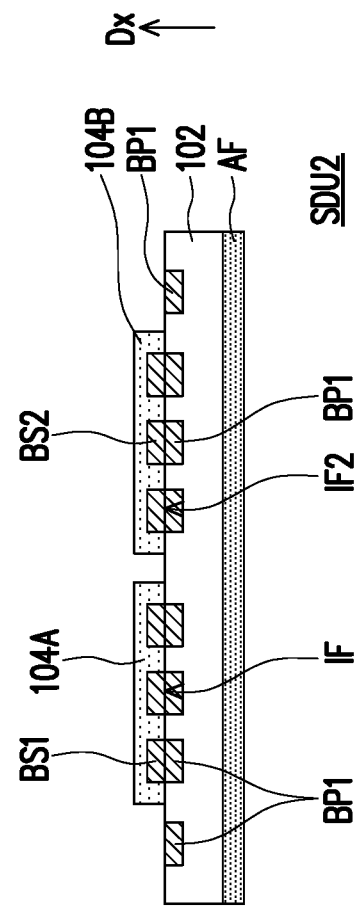
FIG. 3 is a schematic sectional view of a stacked die unit according to some other exemplary embodiments of the present disclosure.

FIG. 3 is a schematic sectional view of a stacked die unit according to some other exemplary embodiments of the present disclosure. The stacked die unit SDU2 illustrated in FIG. 3 is similar to the stacked die unit SDU' illustrated in FIG. 1E. Therefore, the same reference numerals are used to refer to the same or liked parts, and its detailed description will be omitted herein. The difference between the stacked die unit SDU2 of FIG. 3 and the stacked die unit SDU' of FIG. 1E is that a second bonding chip 104B (auxiliary bonding chips) is further provided. In the exemplary embodiment, when the first bonding chip 104A is a controller chip used for logic control, the second bonding chip 104B (auxiliary bonding chips) may be any selected from application-specific integrated circuit (ASIC) chips, analog chips (for example, wireless and radio frequency chips), digital chips (for example, a baseband chip), integrated passive devices (IPDs), voltage regulator chips, sensor chips, memory chips, or the like. The disclosure is not limited thereto. In some embodiments, the second bonding chip 104B (auxiliary bonding chips) and the first bonding chip 104A may also be the same type of controller chip. In alternative embodiments, the second bonding chip 104B (auxiliary bonding chips) and the first bonding chip 104A are different type of chips.

As illustrated in FIG. 3, the second bonding chip 104B is stacked on the first semiconductor die 102 adjacent to the first bonding chip 104A. In some embodiments, the first bonding chips 104A and the second bonding chips 104B are located on a same surface of the first semiconductor die 102, and have the same thickness. In some embodiments, the second bonding chip 104B (auxiliary bonding chips) has a plurality of second bonding structures BS2. The second bonding structures BS2 are embedded in dielectric materials (not shown) of the second bonding chip 104B, while a portion of the second bonding structures BS2 are revealed at a surface of the second bonding chip 104B. In some embodiments, the second bonding structures BS2 are bonded to the first bonding pads BP1 by hybrid bonding (through a hybrid bonding interface IF2). In certain embodiments, the second bonding chips 104B (auxiliary bonding chips) are stacked on the first semiconductor dies 102 (base semiconductor die) in a way that the first bonding pads BP1 faces the second bonding structures BS2 so that they are physically bonded or joined with one another at the hybrid bonding interface IF2.

Figure 4:
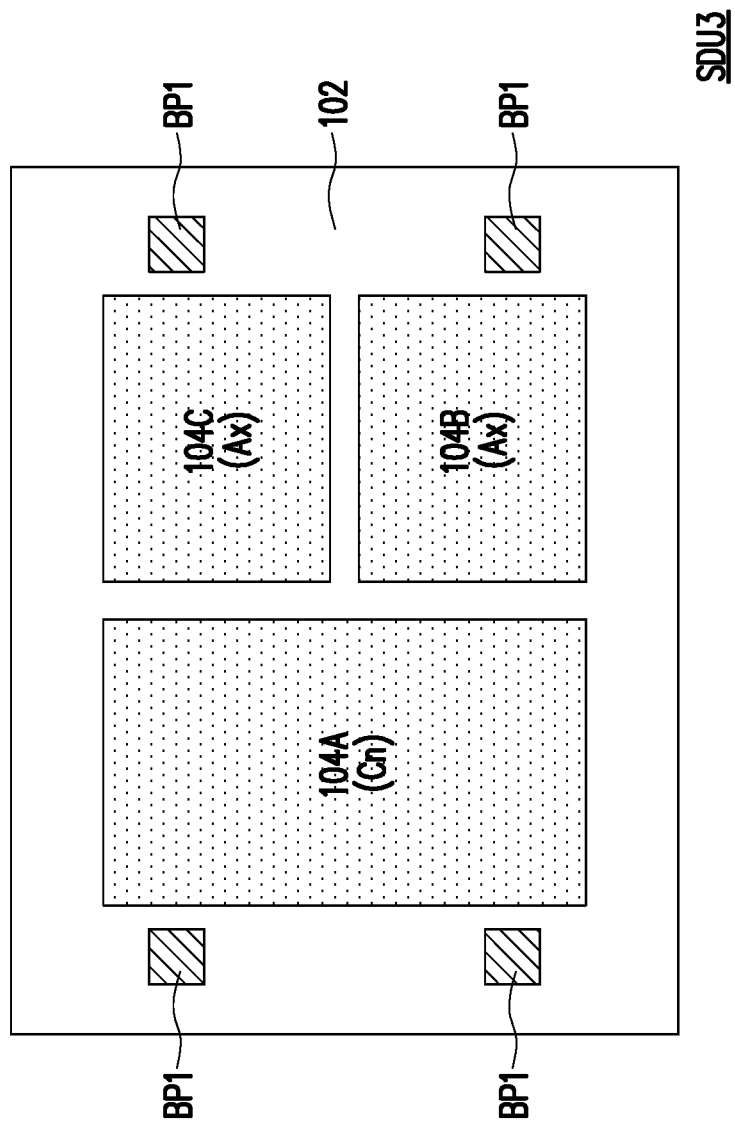
FIG. 4 is a schematic top view of a stacked die unit according to some other exemplary embodiments of the present disclosure.

FIG. 4 is a schematic top view of a stacked die unit according to some other exemplary embodiments of the present disclosure. The stacked die unit SDU3 illustrated in FIG. 4 is similar to the stacked die unit SDU2 illustrated in FIG. 3. Therefore, the same reference numerals are used to refer to the same or liked parts, and its detailed description will be omitted herein. The difference between the stacked die unit SDU3 of FIG. 4 and the stacked die unit SDU2 of FIG. 3 is that a third bonding chip 104C (auxiliary bonding chip Ax) is further provided. For example, the third bonding chip 104C may be any type of chips similar to those listed for the second bonding chip 104B, and it may be similarly bonded to the first semiconductor die 102 through hybrid bonding. In the exemplary embodiment, although only three bonding chips are illustrated (104A, 104B and 104C), it should be noted that the number of bonding chips stacked on the first semiconductor die 102 is not limited thereto. For example, as long as one first bonding chip 104A acting as a controller chip Cn is used for logic control, the number of auxiliary bonding chips Ax stacked on the first semiconductor die 102 is not particularly limited, and can be adjusted based on product requirement.

In some embodiments, the number of auxiliary bonding chips Ax stacked on the first semiconductor die 102 may be three or more. Furthermore, the dimensions (or size) of the first bonding chip 104A (controller chip Cn), and the auxiliary bonding chips Ax (second and third bonding chips 104B, 104C) are not particularly limited. For example, in the illustrated embodiment, the dimensions (or size) of the first bonding chip 104A (controller chip Cn) is greater than that of the auxiliary bonding chips Ax (second and third bonding chips 104B, 104C). However, in alternative embodiments, the dimensions (or size) of the first bonding chip 104A (controller chip Cn) is smaller than that of the auxiliary bonding chips Ax (second and third bonding chips 104B, 104C). In certain embodiments, when a plurality of auxiliary bonding chips Ax (second and third bonding chips 104B, 104C) exists, they may have the same dimensions and sizes, alternatively, they may have different dimensions and sizes. The disclosure is not limited thereto.

FIG. 5A to FIG. 5D are schematic sectional views of various stacked die units according to some other exemplary embodiments of the present disclosure. The stacked die units (SDU4, SDU5, SDU6 and SDU7) illustrated in FIG. 5A to FIG. 5D are similar to the stacked die unit SDU' illustrated in FIG. 1E. Therefore, the same reference numerals are used to refer to the same or liked parts, and its detailed description will be omitted herein. In the above-mentioned embodiments, the bonding structures (BS1, BS2) hybrid bonded to the first bonding pads BP1 have the same size or dimension with the first bonding pads BP1 (with matching hybrid bonding surfaces), and one bonding structure (BS1 or BS2) is respectively bonded to one first bonding pad BP1. However, the disclosure is not limited thereto.

Figure 5A:
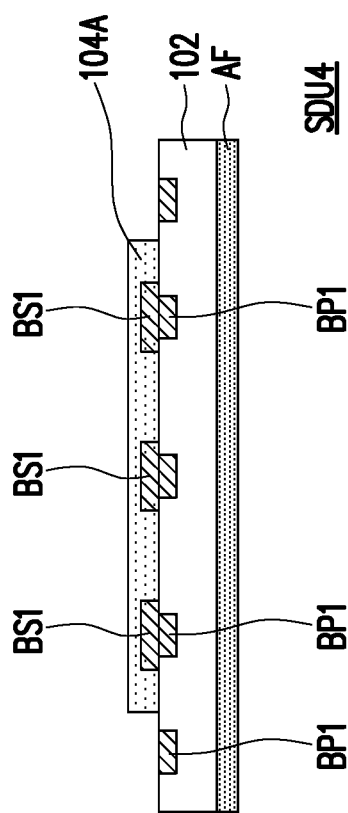
FIG. 5A to FIG. 5D are schematic sectional views of various stacked die units according to some other exemplary embodiments of the present disclosure.
Figure 5B:
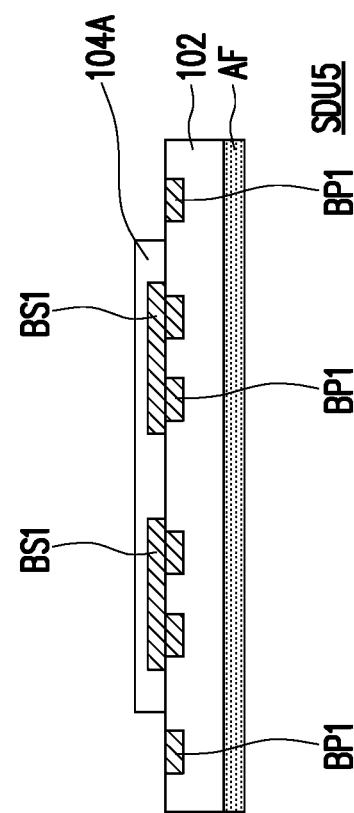

For example, in the stacked die unit SDU4 illustrated in FIG. 5A, in some embodiments, the size or dimension of the first bonding structure BS1 is greater than the size or dimension of the first bonding pads BP1. In other words, a bonding surface of the first bonding structure BS1 is greater than a bonding surface of the first bonding pads BP1. Furthermore, in the stacked die unit SDU5 illustrated in FIG. 5B, in some embodiments, due to the greater size, dimension (or bonding surface) of the first bonding structure BS1, two or more first bonding pads BP1 may be hybrid bonded to one first bonding structure BS1.

Figure 5C:
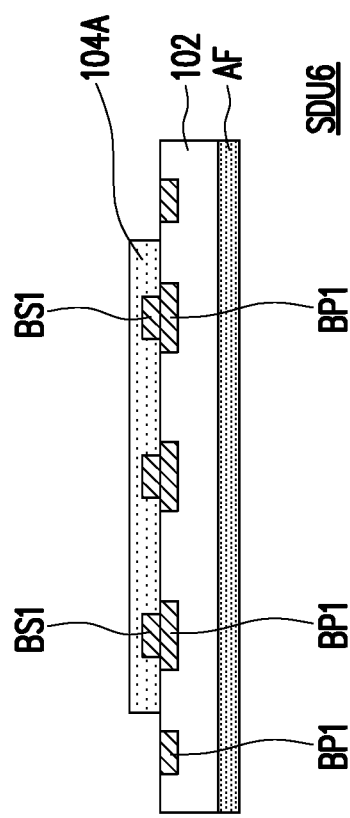
Figure 5D:
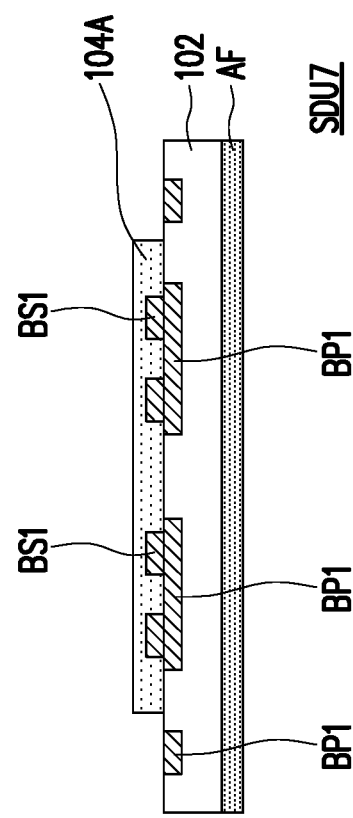

Similarly, in the stacked die unit SDU6 illustrated in FIG. 5C, in some embodiments, the size or dimension of the first bonding pads BP1 is greater than the size or dimension of the first bonding structure BS1. In other words, a bonding surface of the first bonding pads BP1 is greater than a bonding surface of the first bonding structure BS1. Furthermore, in the stacked die unit SDU7 illustrated in FIG. 5D, in some embodiments, due to the greater size, dimension (or bonding surface) of the first bonding pads BP1, two or more first bonding structures BS1 may be hybrid bonded to one first bonding pad BP1. By adjusting the size or dimension of the first bonding pads BP1 or the first bonding structure BS1, due to an increased surface area for bonding, the hybrid bonding between the first bonding structures BS1 and the first bonding pads BP1 may be more efficiently achieved.

Figure 6A:
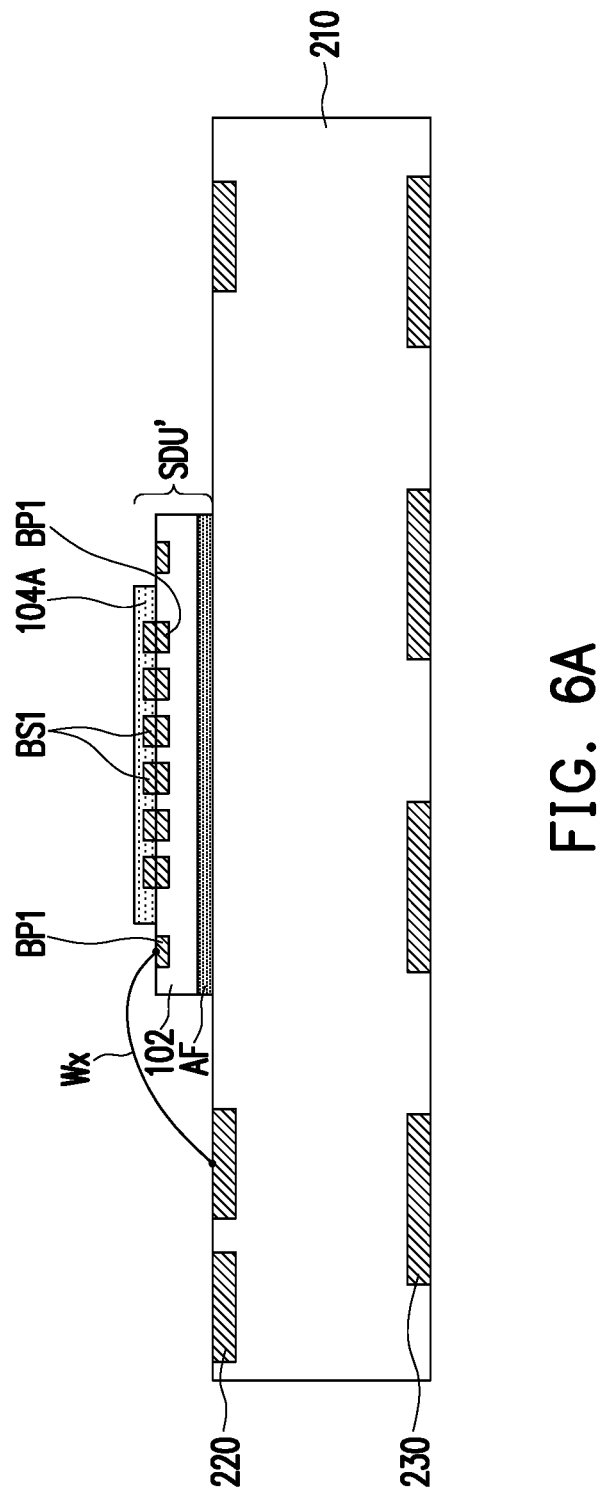
FIG. 6A to FIG. 6D are schematic sectional views of various stages in a method of fabricating a package structure according to some exemplary embodiments of the present disclosure.

FIG. 6A to FIG. 6D are schematic sectional views of various stages in a method of fabricating a package structure according to some exemplary embodiments of the present disclosure. Referring to FIG. 6A, a semiconductor substrate 210 is provided. In some embodiments, the semiconductor substrate 210 includes a plurality of conductive pads 220 and a plurality of conductive pads 230 located on two opposing surfaces of the semiconductor substrate 210. In some embodiments, through insulator vias (not shown) may be used to provide electrical connection between the conductive pads 220 and the conductive pads 230. In some embodiments, the semiconductor substrate 210 may be a bulk silicon substrate or a silicon-on-insulator (SOI) substrate, and further includes active components (e.g., transistors or the like) and optionally passive components (e.g., resistors, capacitors, inductors or the like) formed therein.

After providing the semiconductor substrate 210, the stacked die unit SDU' formed in FIG. 1E is provided over the semiconductor substrate 210. For example, the stacked die unit SDU' is attached to the semiconductor substrate 210 through an adhesive layer AF. In some embodiments, bonding wires Wx are used for providing electrical connection between the stacked die unit SDU' and the conductive pads 220. For example, the bonding wires Wx electrically connects the first bonding pads BP1 of the first semiconductor die 102 that are not covered by the first bonding chips 104A to the conductive pads 220 of the semiconductor substrate 210. In some embodiments, the bonding wires Wx are electrically connected to some of the revealed first bonding pads BP1, while some other revealed first bonding pads BP1 are unconnected. In some embodiments, only one bonding wire Wx is used for providing electrical connection, but the disclosure is not limited thereto, and the number of bonding wires connected to each stacked die unit SDU' may be appropriately adjusted.

Figure 6B:
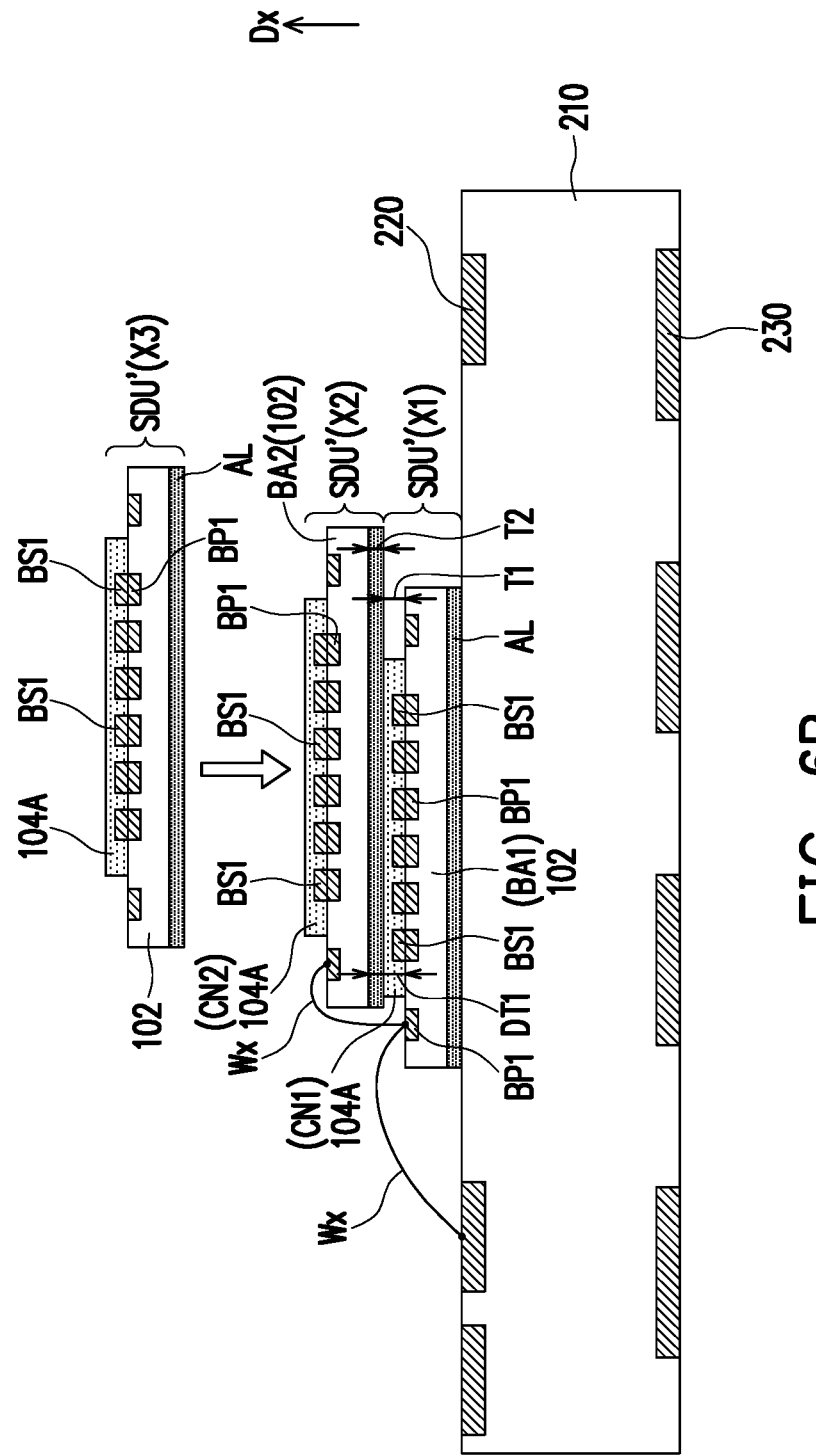

Referring to FIG. 6B, in a next step, a plurality of stacked die units SDU' are stacked on top of one another in the build-up direction Dx. For example, the bottommost stacked die unit SDU' may be referred as the first stacked die unit X1, while those stacked die units SDU' stacked on the first stacked die unit X1 may be sequentially referred as the second stacked die unit X2 and the third stacked die unit X3 etc. In the exemplary embodiment, each of the stacked die unit SDU' (X1, X2 and X3) includes the first semiconductor die 102 (base semiconductor die) and a first bonding chip 104A (controller chip) bonded to the first semiconductor die 102 through hybrid bonding. In some embodiments, the first semiconductor die 102 of the second stacked die unit X2 (second base semiconductor die BA2) is attached to the first bonding chip 104A (first controller chip CN1) of the first stacked die unit X1 through an adhesive layer AL.

Furthermore, in some embodiments, the first semiconductor die 102 of the second stacked die unit X2 (second base semiconductor die BA2) is being spaced apart from the first semiconductor die 102 of the first stacked die unit X1 (first base semiconductor die BA1) by a first distance DT1. In other words, the first semiconductor die 102 of the second stacked die unit X2 (second base semiconductor die BA2) is not in direct contact with the first semiconductor die 102 of the first stacked die unit X1 (first base semiconductor die BA1). In certain embodiments, the first distance DT1 is equal to a sum of a thickness T1 of the first controller chip CN1 (first bonding chip 104A) and a thickness T2 of the adhesive layer AL. After stacking the second stacked die unit X2 over the first stacked die unit X1, their first bonding pads BP1 may be electrically connected to one another through bonding wires Wx. In some embodiments, the first bonding pads BP1 of the second stacked die unit X2 may be directly connected to the conductive pads 220 of the semiconductor substrate 210 without passing through the first bonding pads BP1 of the first stacked die unit X1. In a similar way, a third stack die unit X3 being the stacked die unit SDU' shown in FIG. 1E, may be stacked on the second stacked die unit X2, wherein the first semiconductor die 102 of the third stacked die unit X3 is attached to the first bonding chip 104A of the second stacked die unit X2 (second controller chip CN2) through an adhesive layer AL.

Figure 6C:
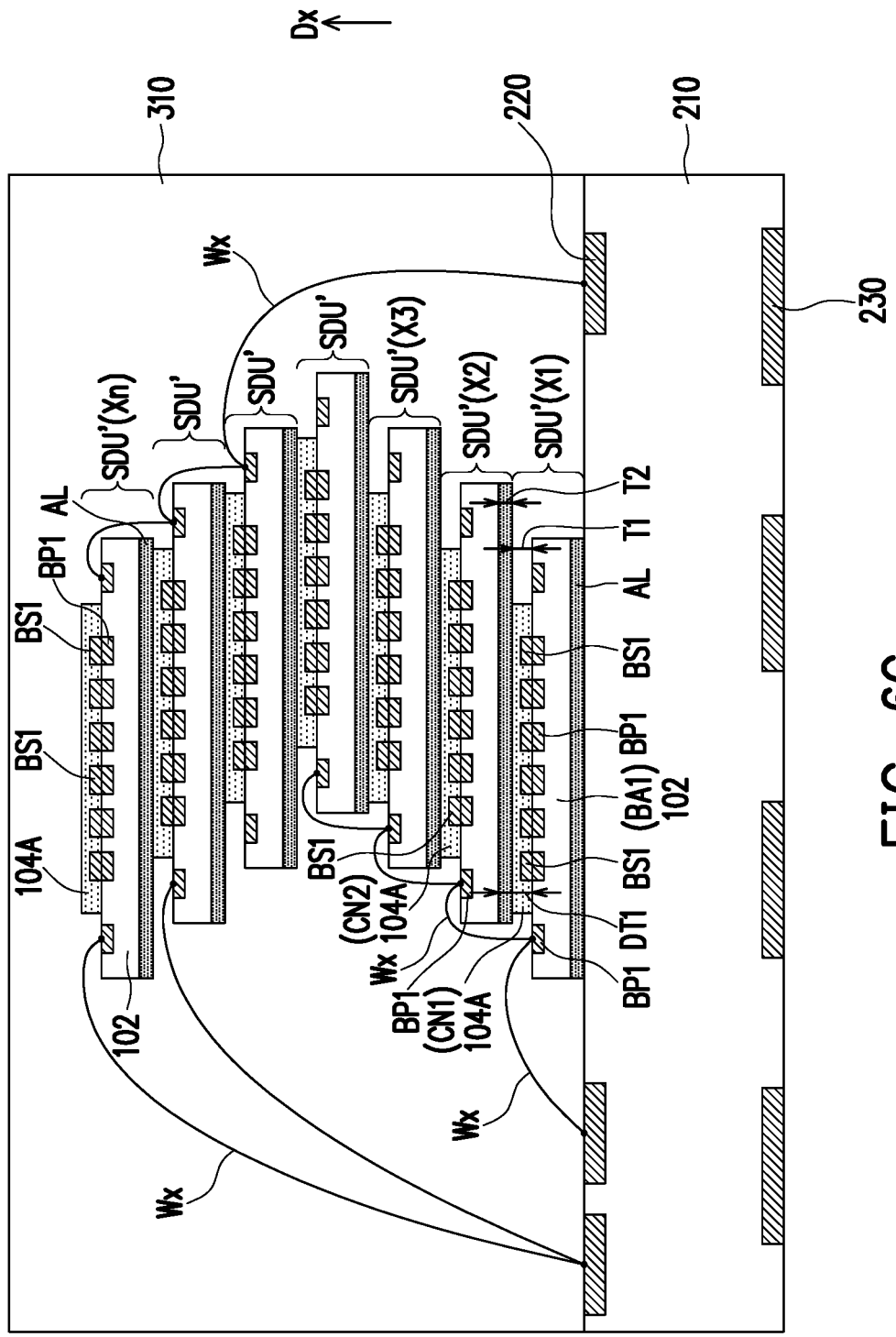

Referring to FIG. 6C, in a next step, the stacked die units SDU' may be stacked over one another until the stacking of a top-most stacked die unit Xn reaches the desired level. The die stacking and wire bonding process may be repeated until all dies are stacked, and where electrical connections are established. Although only seven staked die units SDU' are illustrated in FIG. 6C, however, the disclosure is not limited thereto. In certain embodiments, the number of staked die units SDU' provided may be more than seven or less than seven, and this can be adjusted based on product requirement. Furthermore, in some embodiments, each of the stacked die units SDU' are directly or indirectly connected to the conductive pads 220 through bonding wires Wx. Upon completion of die stacking and wire bonding, an insulating encapsulant 310 is formed on the semiconductor substrate 210 to encapsulate the plurality of stacked die units SDU' and the bonding wires Wx. In some embodiments, the insulating encapsulant 310 is formed through, for example, a compression molding process, whereby the insulating encapsulant 310 fills up a space between each of the stacked die units SDU'. For instance, the insulating encapsulant 310 fills up the space between the first semiconductor die 102 of the first stacked die unit X1 (first base semiconductor die BA1) and the first semiconductor die 102 of the second stacked die unit X2 (second base semiconductor die BA2) defined by the first distance DT1.

In some embodiments, the insulating encapsulant 310 includes polymers (such as epoxy resins, phenolic resins, silicon-containing resins, or other suitable resins), dielectric materials having low permittivity (Dk) and low loss tangent (DO properties, or other suitable materials. In an alternative embodiment, the insulating encapsulant 310 may include an acceptable insulating encapsulation material. In some embodiments, the insulating encapsulant 310 may further include inorganic filler or inorganic compound (e.g. silica, clay, and so on) which can be added therein to optimize coefficient of thermal expansion (CTE) of the insulating encapsulant 310. The disclosure is not limited thereto.

Figure 6D:
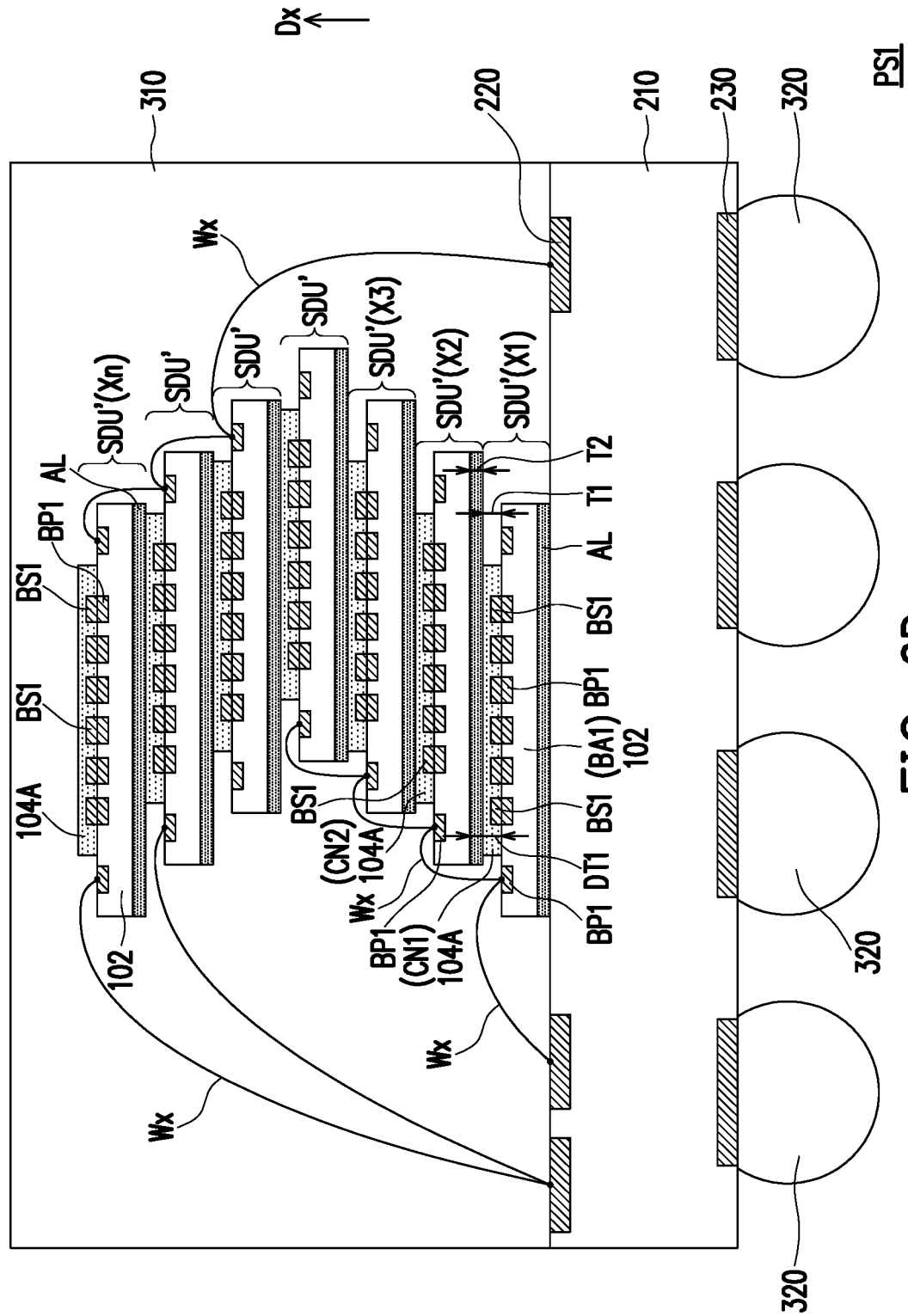

Referring to FIG. 6D, after forming the insulating encapsulant 310, a plurality of conductive balls 320 may be placed on the semiconductor substrate 210 on a side opposite to where the stacked die units SDU' are located. In some embodiments, the conductive balls 320 may be electrically connected to the conductive pads 230 of the semiconductor substrate 210. In some embodiments, the conductive balls 320 are formed on each of the conductive pads 230. In certain embodiments, the number of conductive balls 320 are not limited to the disclosure, and may be designated and selected based on the number of the conductive pads 230. In some embodiments, the conductive balls 320 are, for example, solder balls or ball grid array (BGA) balls. After placing the conductive balls 320 on the semiconductor substrate 210, a package structure PS1 (stacking structure) according to some embodiments of the present disclosure is fabricated.

FIG. 7A to FIG. 7D are schematic sectional views of various stages in a method of fabricating a package structure according to some other exemplary embodiments of the present disclosure. The method illustrated in FIG. 7A to FIG. 7D is similar to the method illustrated in FIG. 6A to FIG. 6D. Therefore, the same reference numerals are used to refer to the same or liked parts, and its detailed description will be omitted herein. The difference between these embodiments is that a redistribution layer 404 is used in replacement of the semiconductor substrate 210 in the methods of FIG. 7A to FIG. 7D. In other words, a substrate-less structure is fabricated.

Figure 7A:
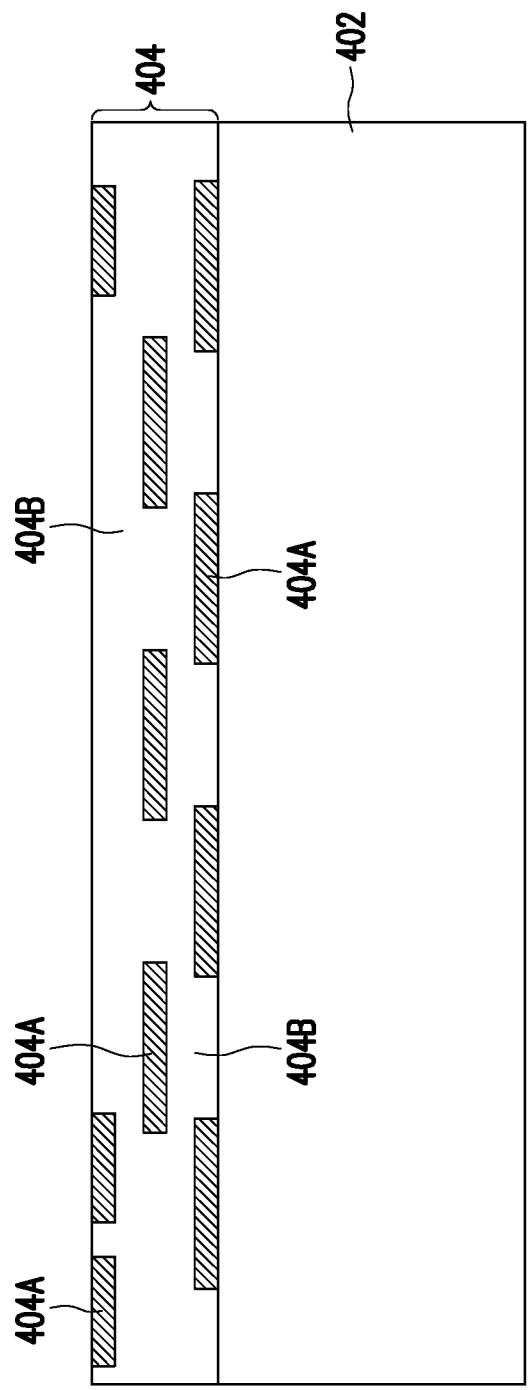
FIG. 7A to FIG. 7D are schematic sectional views of various stages in a method of fabricating a package structure according to some other exemplary embodiments of the present disclosure.

Referring to FIG. 7A, a carrier 402 is provided. In some embodiments, the carrier 402 may be a glass carrier or any suitable carrier for carrying components that are used in the manufacturing method of a package structure. In some embodiments, the carrier 402 is coated with a debond layer (not shown). For example, the debond layer may be any material suitable for bonding and de-bonding the carrier 402 from the above layer(s) or any wafer(s) disposed thereon.

In some embodiments, the debond layer may include a dielectric material layer made of a dielectric material including any suitable polymer-based dielectric material (such as benzocyclobutene ("BCB"), polybenzoxazole ("PBO")). In an alternative embodiment, the debond layer may include a dielectric material layer made of an epoxy-based thermal-release material, which loses its adhesive property when heated, such as a light-to-heat-conversion (LTHC) release coating film. In a further alternative embodiment, the debond layer may include a dielectric material layer made of an ultra-violet (UV) glue, which loses its adhesive property when exposed to UV lights. In certain embodiments, the debond layer may be dispensed as a liquid and cured, or may be a laminate film laminated onto the carrier 402, or may be the like. In certain embodiments, the debond layer is, for example, a LTHC layer with good chemical resistance, and such layer enables room temperature de-bonding from the carrier 402 by applying laser irradiation, however the disclosure is not limited thereto.

As illustrated in FIG. 7A, after providing the carrier 402, a redistribution layer 404 is formed on the carrier 402 over the debond layer. In some embodiments, the formation of the redistribution layer 404 includes sequentially forming one or more conductive layers 404A, and one or more dielectric layers 404B in alternation. In certain embodiments, the conductive layers 404A are sandwiched between the dielectric layers 404A. It should be noted that the number of conductive layers 404A and dielectric layers 404B formed in the redistribution layer 404 is not limited thereto, and this may be adjusted based on product requirement.

In some embodiments, the conductive layers 404A may be made of conductive materials formed by electroplating or deposition, such as aluminum, titanium, copper, nickel, tungsten, and/or alloys thereof, which may be patterned using a photolithography and etching process. In some embodiments, the conductive layers 404A may be patterned copper layers or other suitable patterned metal layers. Throughout the description, the term "copper" is intended to include substantially pure elemental copper, copper containing unavoidable impurities, and copper alloys containing minor amounts of elements such as tantalum, indium, tin, zinc, manganese, chromium, titanium, germanium, strontium, platinum, magnesium, aluminum or zirconium, etc.

In certain embodiments, the dielectric layers 404B may be polyimide, polybenzoxazole (PBO), benzocyclobutene (BCB), a nitride such as silicon nitride, an oxide such as silicon oxide, phosphosilicate glass (PSG), borosilicate glass (BSG), boron-doped phosphosilicate glass (BPSG), a combination thereof or the like, which may be patterned using a photolithography and/or etching process. In some embodiments, the dielectric layers 404B may be formed by suitable fabrication techniques such as spin-on coating, chemical vapor deposition (CVD), plasma-enhanced chemical vapor deposition (PECVD) or the like. The disclosure is not limited thereto.

Figure 7B:
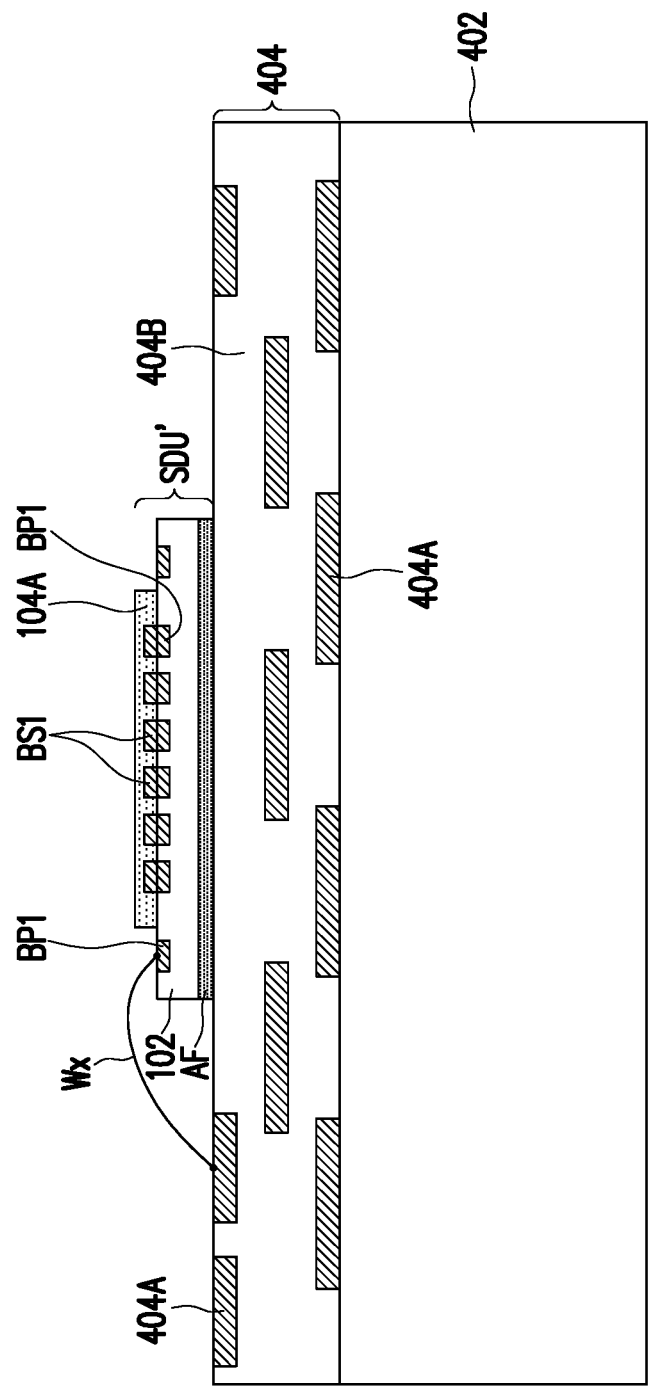

Referring to FIG. 7B, after forming the redistribution layer 404, the stacked die unit SDU' formed in FIG. 1E is provided over the redistribution layer 404. For example, the stacked die unit SDU' is attached to the redistribution layer 404 through an adhesive layer AF. In certain embodiments, the stacked die unit SDU' is attached to the dielectric layer 404B through the adhesive layer AF. In a similar way to the method described in FIG. 6A, bonding wires Wx are used for providing electrical connection between the stacked die unit SDU' and the conductive layers 404A of the redistribution layer 404. In the exemplary embodiment, the electrical connection between the bonding wires Wx and the redistribution layer 404 may be appropriately adjusted as long as an electrical connection is established.

Figure 7C:
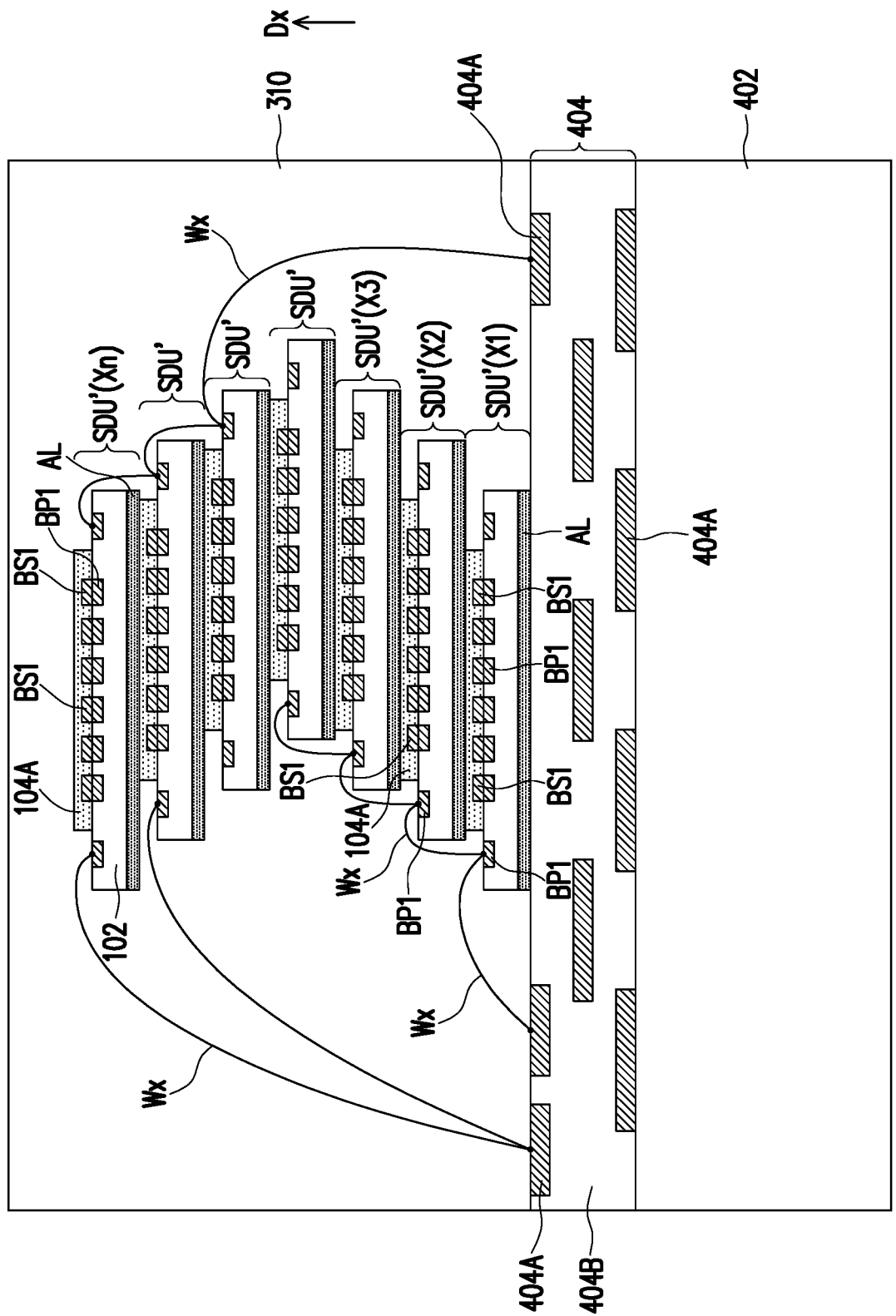

Referring to FIG. 7C, the same steps described in FIG. 6C may be performed to complete the stacking of the stacked die units SDU', whereby the die stacking and wire bonding process may be repeated until all dies are stacked, and where electrical connections are established. Upon completion of die stacking and wire bonding, the insulating encapsulant 310 is formed over the redistribution layer 404 to encapsulate the stacked die units SDU' and to encapsulate the bonding wires Wx.

Figure 7D:
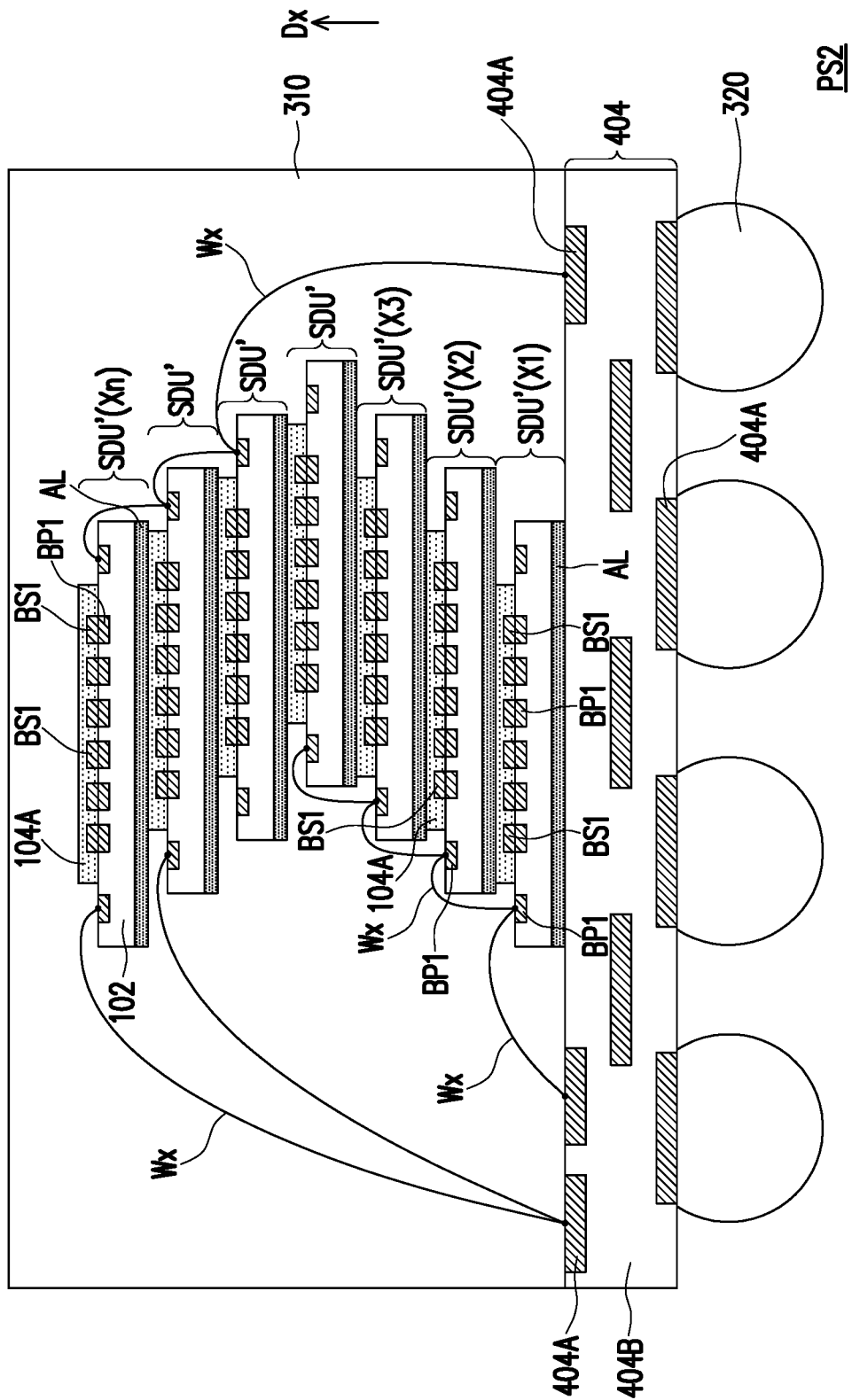

Referring to FIG. 7D, in a next step, a debonding process may be performed so as to separate the carrier 402 from the above components. In some embodiments, the de-bonding process includes projecting a light such as a laser light or an UV light on the debond layer (e.g., the LTHC release layer) so that the carrier 402 can be easily removed along with the debond layer. After the de-bonding process, a backside surface of the redistribution layer 404 is revealed or exposed. In certain embodiments, some of the conductive layers 404A are exposed on the backside surface of the redistribution layer 404. Subsequently, a plurality of conductive balls 320 may be placed on the redistribution layer 404 on a side opposite to where the stacked die units SDU' are located. In some embodiments, the conductive balls 320 may be electrically connected to the exposed conductive layers 404A of the redistribution layer 404. After placing the conductive balls 320 on the redistribution layer 404, a package structure PS2 (stacking structure) according to some embodiments of the present disclosure is fabricated.

Figure 8:
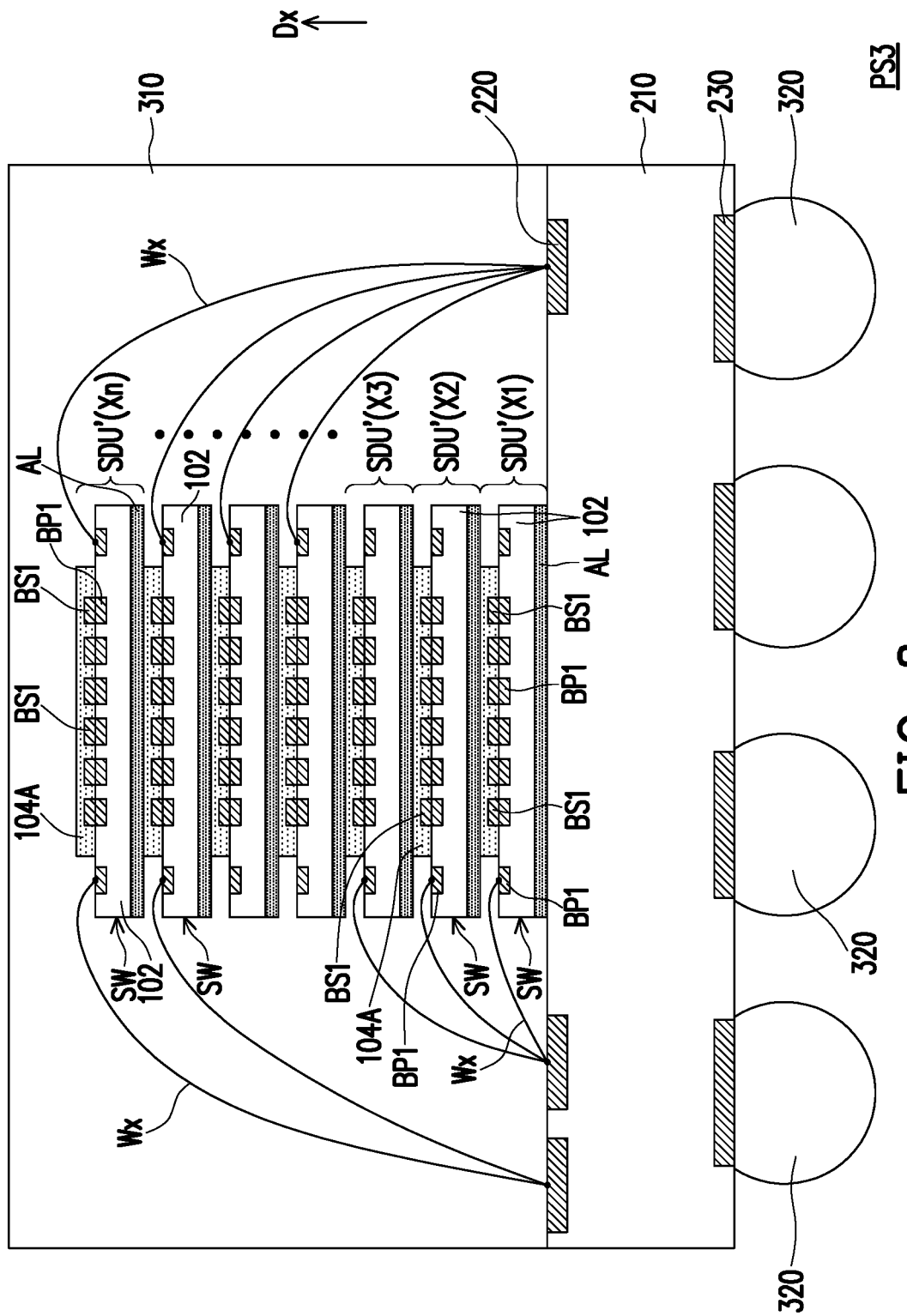
FIG. 8 is a schematic sectional view of a package structure according to some other exemplary embodiments of the present disclosure.

FIG. 8 is a schematic sectional view of a package structure according to some other exemplary embodiments of the present disclosure. The package structure PS3 illustrated in FIG. 8 is similar to the package structure PS1 illustrated in FIG. 6D. Therefore, the same reference numerals are used to refer to the same or liked parts, and its detailed description will be omitted herein. The difference between the package structure PS1 illustrated in FIG. 6D and the package structure PS3 illustrated in FIG. 8 is in the stacking arrangements of the stacked die units SDU'. As illustrated in FIG. 6D, the stacked die units SDU' of the package structure PS1 is stacked in a way where a stacked die unit SDU' is not aligned with a subsequent stacked die unit SDU' located thereon (e.g. unit X1 not aligned with unit X2). However, the disclosure is not limited thereto. For example, in the embodiment illustrated in FIG. 8, the package structure PS3 (stacking structure) include stacked die units SDU' that are aligned with one another. That is, sidewalls SW of the first semiconductor die 102 in one of the stacked die units SDU' is aligned with sidewalls SW of the first semiconductor die 102 in another one of the stacked die units SDU' (e.g. first semiconductor dies 102 in unit X1 and X2 have sidewalls SW that are aligned). In the illustrated embodiment, all of the stacked die units SDU' have first semiconductor dies 102 with their sidewalls SW aligned. However, the disclosure is not limited thereto. In alternative embodiments, in one package structure, some stacked die units SDU' may have first semiconductor dies 102 with their sidewalls SW aligned, while some other stacked die units SDU' may have first semiconductor dies 102 with their sidewalls SW not aligned.

Figure 9:
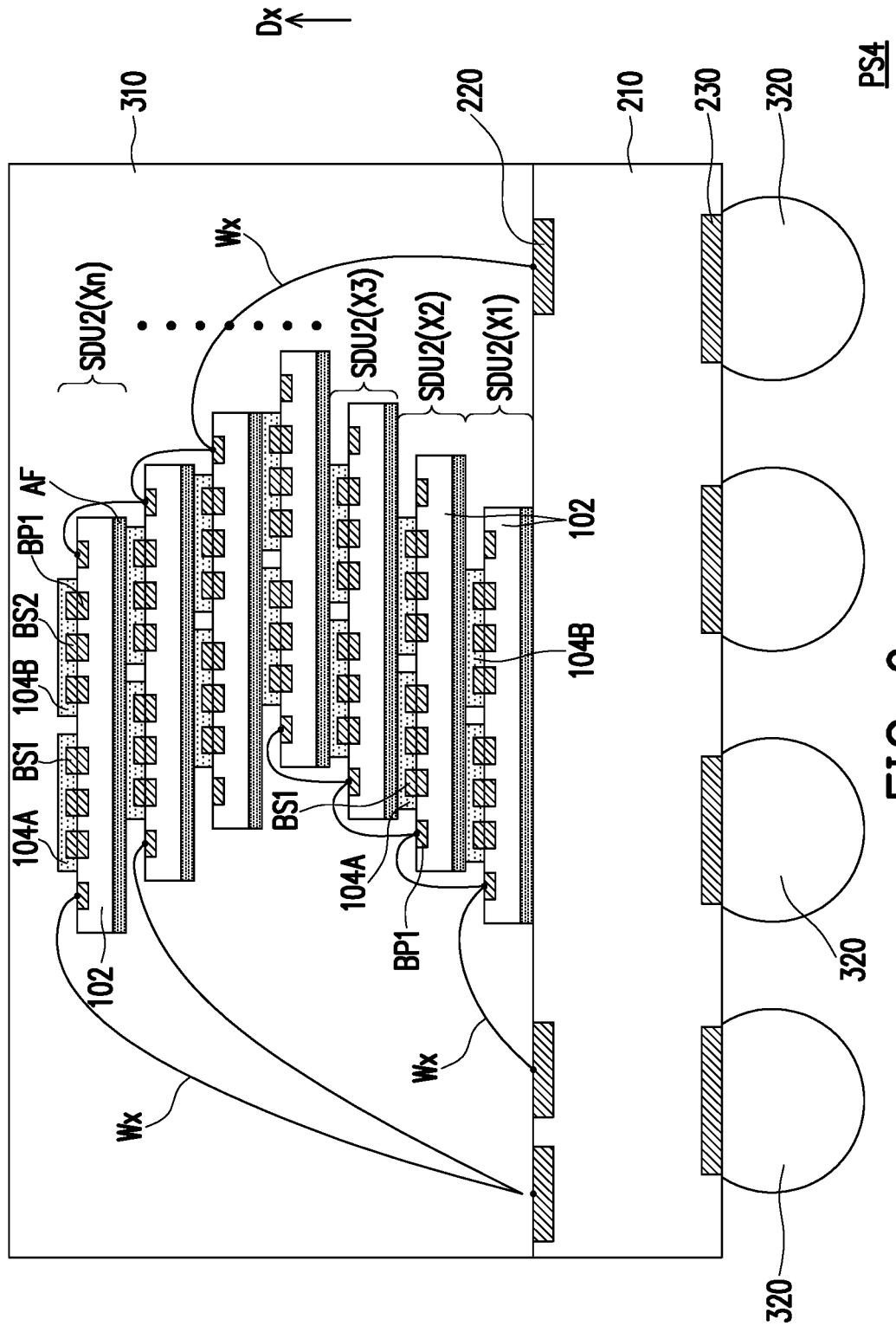
FIG. 9 is a schematic sectional view of a package structure according to some other exemplary embodiments of the present disclosure.

FIG. 9 is a schematic sectional view of a package structure according to some other exemplary embodiments of the present disclosure. The package structure PS4 illustrated in FIG. 9 is similar to the package structure PS1 illustrated in FIG. 6D. Therefore, the same reference numerals are used to refer to the same or liked parts, and its detailed description will be omitted herein. The difference between the package structure PS1 illustrated in FIG. 6D and the package structure PS4 illustrated in FIG. 8 is in the type of stacked die units used for stacking. For example, as illustrated in FIG. 6D, all of the stacked die units SDU' have one first bonding chip 104A (controller chip) bonded to one first semiconductor die 102 in the build-up direction Dx. However, the disclosure is not limited thereto. As illustrated in the embodiment shown in FIG. 9, the package structure PS4 (stacking structure) includes a plurality of stacked die units SDU2 described in FIG. 3 stacked on top of one another. In other words, each of the stacked die units SDU2 includes at least a first bonding chip 104A (controller chip) and a second bonding chip 104B (auxiliary bonding chip) hybrid bonded to one first semiconductor die 102. From this embodiment, it can be noted that the type of stacked die unit used in the package structure is not particularly limited, and can be any of those illustrated from FIG. 1D to FIG. 5D.

Figure 10:
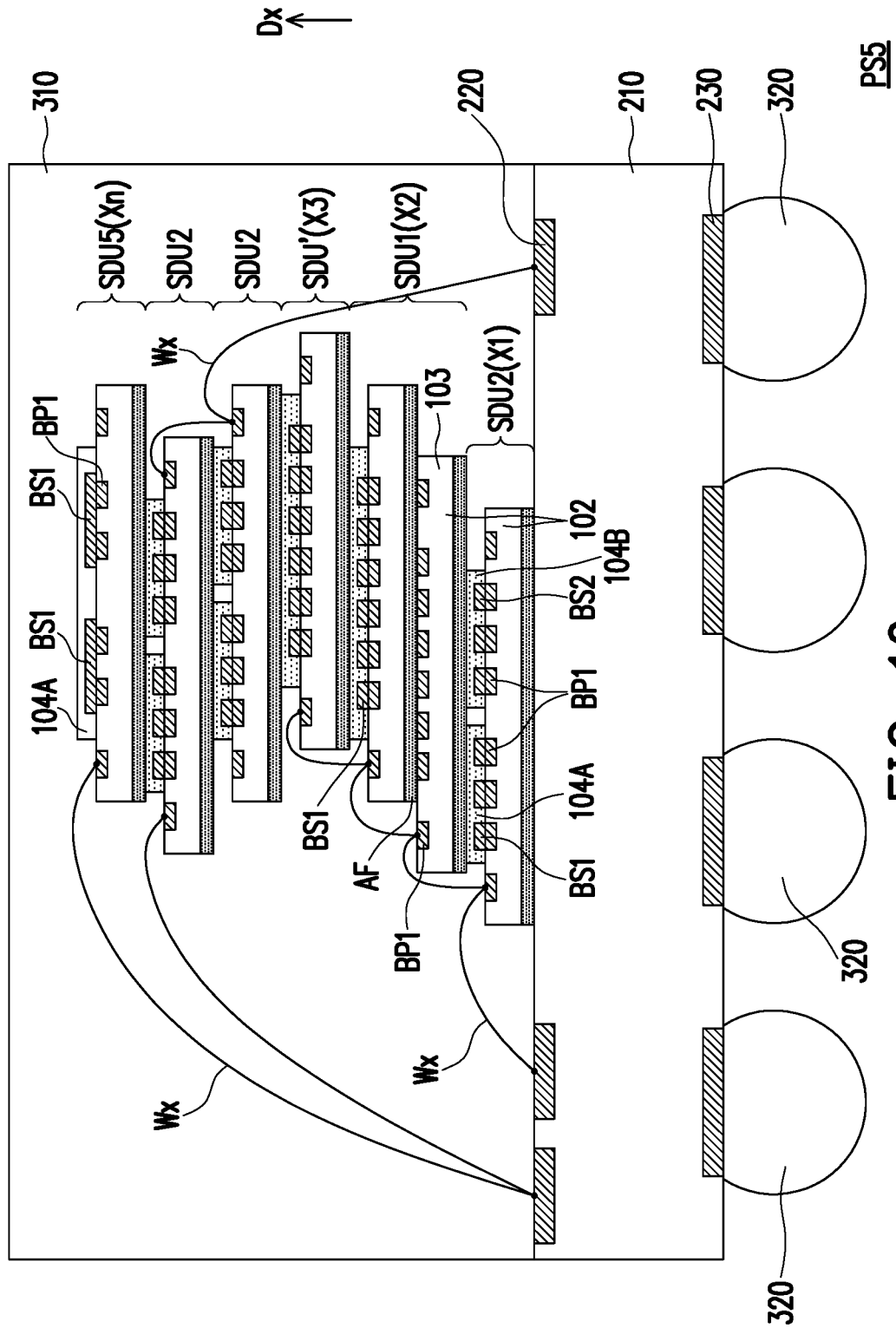
FIG. 10 is a schematic sectional view of a package structure according to some other exemplary embodiments of the present disclosure.

FIG. 10 is a schematic sectional view of a package structure according to some other exemplary embodiments of the present disclosure. The package structure PS5 illustrated in FIG. 10 is similar to the package structure PS1 illustrated in FIG. 6D. Therefore, the same reference numerals are used to refer to the same or liked parts, and its detailed description will be omitted herein. In the above-mentioned embodiments, all the package structures use the same type of stacked die units for forming the stacking structure. However, the disclosure is not limited thereto. For example, as illustrated in FIG. 10, various different types of stacked die units (SDU', SDU1, SDU2, SDU5) are used in combination for forming the package structure PS5 (stacking structure). In the illustrated embodiment, the stacked die unit SDU2 described in FIG. 3 is provided over the semiconductor substrate 210 and being treated as the first stacked die unit X1. Subsequently, the stacked die unit SDU1, the stacked die unit SDU', two stacked die units SDU2 and the stacked die unit SDU5 may then be sequentially stacked on top of one another in the build-up direction Dx to form the package structure PS5. From this embodiment, it can be noted that different stacked die units may be stacked on top of one another based on design requirements, and there is no particular preference in the stacking order of these stacked die units. In other words, the stacking of all of the stacked die units (SDU, SDU', SDU1, SDU2, SDU3, SDU4, SDU5, SDU6, SDU7) may be appropriately selected and combined.

Figure 11:
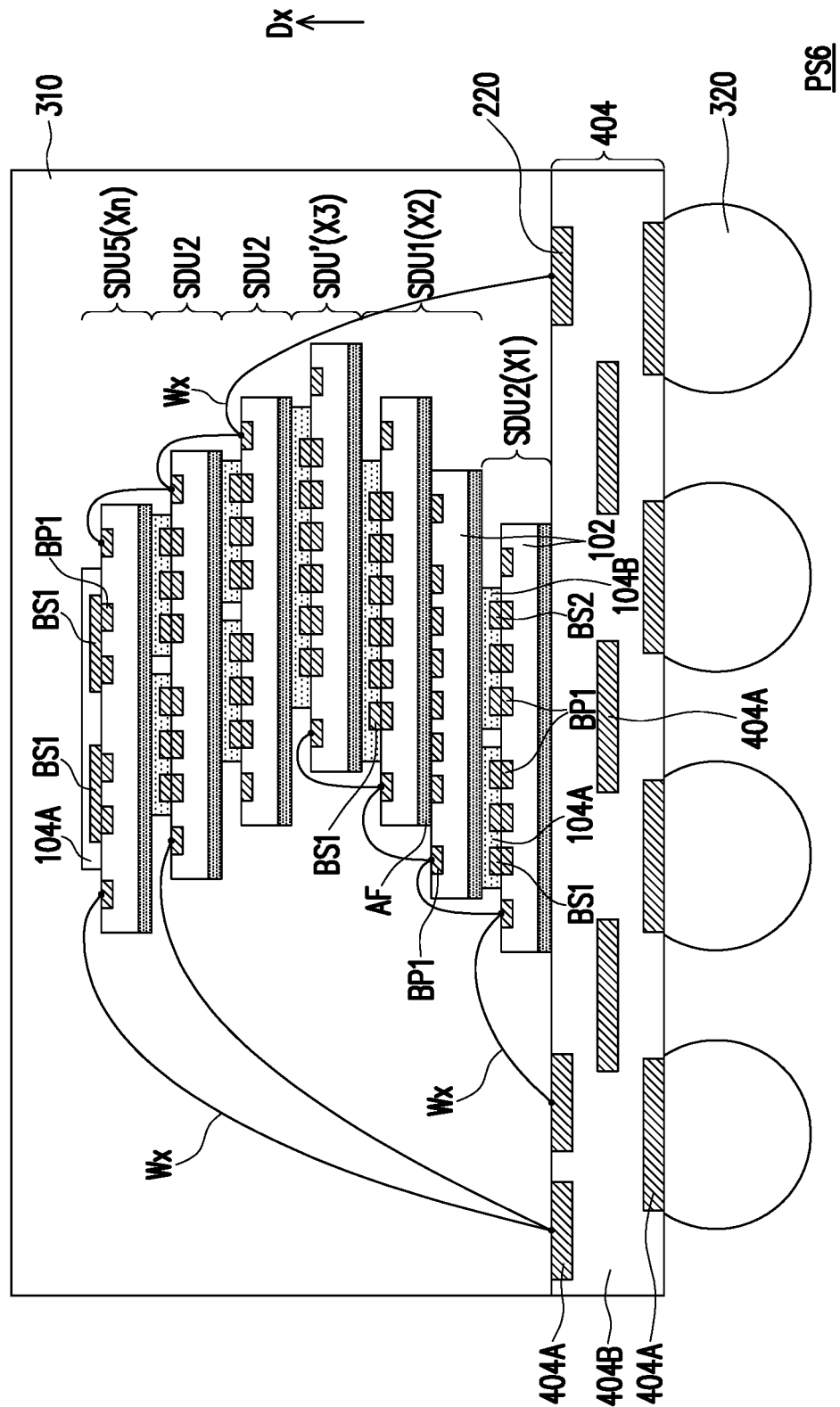
FIG. 11 is a schematic sectional view of a package structure according to some other exemplary embodiments of the present disclosure.

FIG. 11 is a schematic sectional view of a package structure according to some other exemplary embodiments of the present disclosure. The package structure PS6 illustrated in FIG. 11 is similar to the package structure PS5 illustrated in FIG. 10. Therefore, the same reference numerals are used to refer to the same or liked parts, and its detailed description will be omitted herein. In the above-mentioned embodiments, the various stacking methods and stacking of different stacked die units (as illustrated in FIGS. 8, 9 and 10) are demonstrated on a semiconductor substrate 210. However, the disclosure is not limited thereto, and the various different stacking methods and stacking of different stacked die units may be applied on the redistribution layer 404. For example, as illustrated in FIG. 11, various different types of stacked die units (SDU', SDU1, SDU2, SDU5) are used in combination for stacking on the redistribution layer 404 to form the package structure PS6 (stacking structure).

Figure 12:
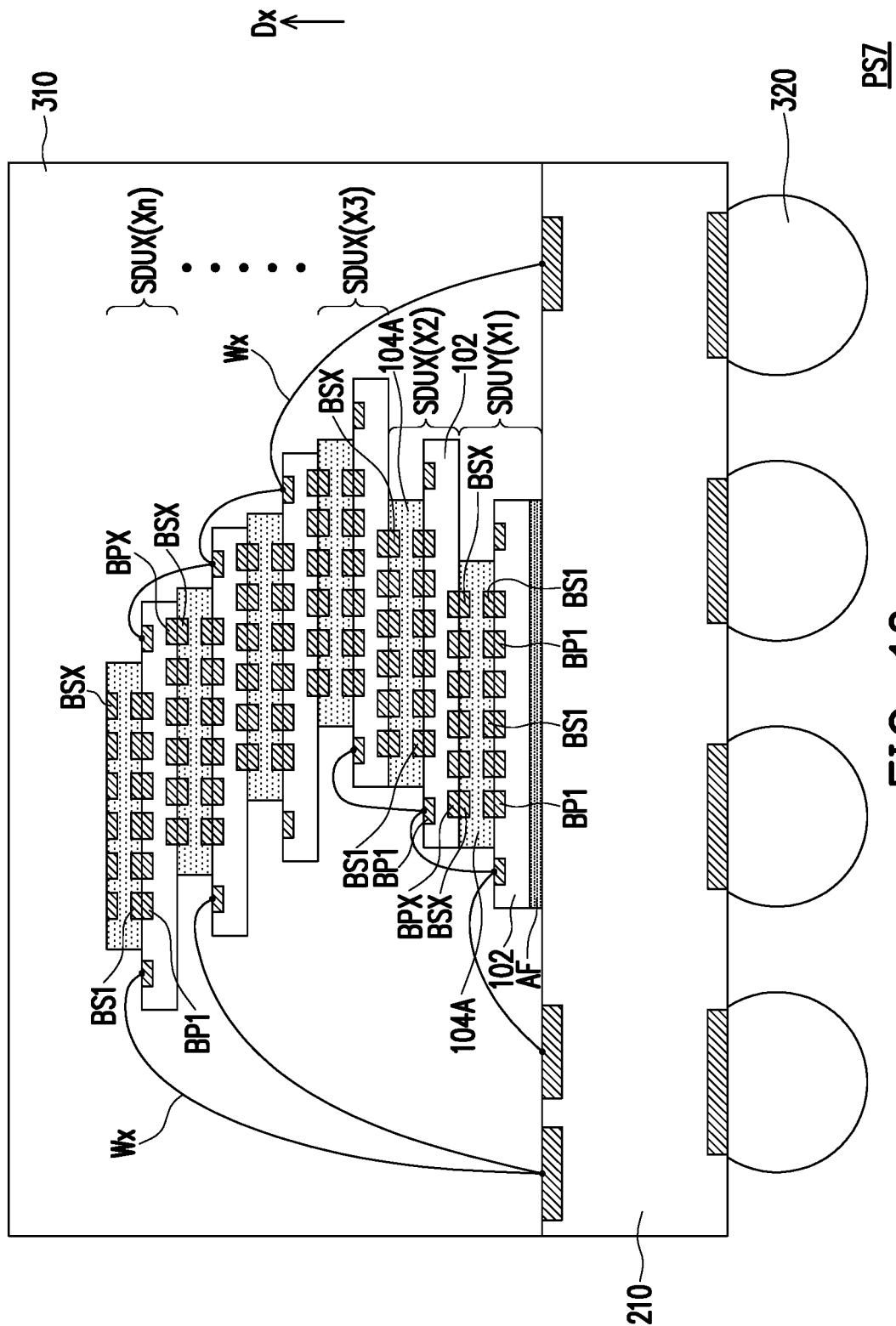
FIG. 12 is a schematic sectional view of a package structure according to some other exemplary embodiments of the present disclosure.

FIG. 12 is a schematic sectional view of a package structure according to some other exemplary embodiments of the present disclosure. The package structure PS7 illustrated in FIG. 12 is similar to the package structure PS1 illustrated in FIG. 6D. Therefore, the same reference numerals are used to refer to the same or liked parts, and its detailed description will be omitted herein. In the above-mentioned embodiments, a stacked die unit may be stacked over another stacked die unit by using an adhesive layer AF. However, the disclosure is not limited thereto. As illustrated in FIG. 12, the first stacked die unit X1 (stacked die unit SDUY) is attached on the semiconductor substrate 210 through an adhesive layer AF. Furthermore, a plurality of stacked die units SDUX are stacked over the first stacked die unit X1 and connected to one another through hybrid bonding. For example, in some embodiments, each stacked die units SDUX includes a first semiconductor die 102 having first bonding pads BP1 and auxiliary bonding pads BPX, wherein the first bonding pads BP1 and the auxiliary bonding pads BPX are located on two opposite surfaces of the first semiconductor die 102. In addition, each stacked die units SDUX further includes first bonding chips 104A (controller chip) having first bonding structures BS1 and auxiliary bonding structures BSX, wherein the first bonding structures BS1 and the auxiliary bonding structures BSX are located on two opposite surfaces of the first bonding chip 104A. In the exemplary embodiment, the first bonding pads BP1 are physically connected to the first bonding structures BS1 through hybrid bonding, while the auxiliary bonding pads BPX are physically connected to the auxiliary bonding structures BSX through hybrid bonding. As such, a plurality of stacked die units stacked on top of one another can be achieved without using adhesive layers.

In the above-mentioned embodiments, the package structure or stacking structure includes a plurality of stacked die units stacked on top of one another, wherein each of the stacked die units include one semiconductor die (such as memory die) and at least one bonding chip (for logic control) hybrid bonded to the semiconductor due. Due to the integration of the bonding chip on the semiconductor die in each of the stacked die unit, the signal transmission performance can be significantly enhanced. Furthermore, by using hybrid bonding for bonding the bonding chips to the semiconductor dies, the package structure may have better form factor. In other words, bonding chips with flexible sizes may be bonded onto the semiconductor die directly through hybrid bonding. Overall, heterogeneous, homogeneous and multi-chip stacking may be achieved through hybrid bonding, allowing more flexible chip size integration and functional chips selection.

In accordance with some embodiments of the present disclosure, a package structure including a plurality of stacked die units and an insulating encapsulant is provided. The plurality of stacked die units is stacked on top of one another, where each of the plurality of stacked die units include a first semiconductor die, a first bonding chip. The first semiconductor die has a plurality of first bonding pads. The first bonding chip is stacked on the first semiconductor die and has a plurality of first bonding structure. The plurality of first bonding structures is bonded to the plurality of first bonding pads through hybrid bonding. The insulating encapsulant is encapsulating the plurality of stacked die units.

In accordance with some other embodiments of the present disclosure, a stacking structure including a first stacked die unit and a second stacked die unit is provided, wherein the second stacked die unit is stacked on the first stacked die unit. The first stacked die unit includes a first base semiconductor die having bonding pads and a first controller chip having bonding structures. The first controller chip is stacked on the first base semiconductor die in a way that the bonding pads of the first base semiconductor die faces the bonding structures of the first controller chip so that they are physically bonded with one another. The second stacked die unit includes a second base semiconductor die having bonding pads and a second controller chip having bonding structures. The second controller chip is stacked on the second base semiconductor die in a way that the bonding pads of the second base semiconductor die faces the bonding structures of the second controller chip so that they are physically bonded with one another. The second base semiconductor die of the second stacked die unit is attached to the first controller chip of the first stacked die unit, and being spaced apart from the first base semiconductor die by a first distance.

In accordance with yet another embodiment of the present disclosure, a method of fabricating a package structure is described. The method includes the following steps. A plurality of stacked die units is formed by the following steps. A semiconductor wafer having a plurality of first semiconductor dies is provided, wherein each of the plurality of first semiconductor dies has a plurality of first bonding pads. A plurality of first bonding chips is stacked on the semiconductor wafer, wherein each of the plurality of first bonding chips has a plurality of first bonding structures, wherein the plurality of first bonding structures is bonded to the plurality of first bonding pads through hybrid bonding. The semiconductor wader is diced to form the plurality of stacked dies units each comprising one of the first bonding chip stacked over one of the first semiconductor die in a build-up direction. The plurality of stacked die units is stacked on top of one another in the build-up direction. An insulating encapsulant is formed to encapsulate the plurality of stacked die units.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A package structure, comprising:
   a plurality of stacked die units stacked on top of one another, wherein each of the plurality of stacked die units comprises:
   a first semiconductor die having a plurality of first bonding pads;
   a first bonding chip stacked on the first semiconductor die and having a plurality of first bonding structures, wherein the plurality of first bonding structures is bonded to the plurality of first bonding pads;
   a second bonding chip stacked on the first semiconductor die adjacent to the first bonding chip and having a plurality of second bonding structures, wherein the plurality of second bonding structures is bonded to the plurality of first bonding pads, and the second bonding chip is physically separated from the first bonding chip on the first semiconductor die;
   an insulating encapsulant encapsulating the plurality of stacked die units and filling into a space between the first bonding chip and the second bonding chip.

2. The package structure according to claim 1, further comprising a semiconductor substrate, wherein the plurality of stacked die units is attached to the semiconductor substrate through an adhesive layer.

3. The package structure according to claim 1, further comprising a redistribution layer wherein the plurality of stacked die units is attached to the redistribution layer through an adhesive layer.

4. The package structure according to claim 1, further comprising a plurality of conductive wires electrically connected to at least one of the first bonding pads in each of the plurality of stacked die units, wherein the insulating encapsulant further encapsulates the conductive wires.

5. The package structure according to claim 1, wherein at least one of the stacked die units further comprises a second semiconductor die having a plurality of second bonding pads, wherein the first semiconductor die is attached to the second semiconductor die through an adhesive layer.

6. The package structure according to claim 1, wherein sidewalls of the first semiconductor die in one of the stacked die units is aligned with sidewalls of the first semiconductor die in another one of the stacked die units.

7. The package structure according to claim 1, wherein the insulating encapsulant covers and is in physical contact with at least one of the plurality of first bonding pads.

8. A stacking structure, comprising:
   a first stacked die unit, the first stacked die unit comprises:
   a first base semiconductor die having bonding pads;
   a first controller chip having bonding structures, wherein the first controller chip is stacked on the first base semiconductor die in a way that a first portion of the bonding pads of the first base semiconductor die faces the bonding structures of the first controller chip so that they are physically bonded with one another, while a second portion of the bonding pads of the first base semiconductor die are exposed;
   a second stacked die unit stacked on the first stacked die unit, wherein the second stacked die unit comprises:
   a second base semiconductor die having bonding pads;
   a second controller chip having bonding structures, wherein the second controller chip is stacked on the second base semiconductor die in a way that a first portion of the bonding pads of the second base semiconductor die faces the bonding structures of the second controller chip so that they are physically bonded with one another, while a second portion of the bonding pads of the second base semiconductor die are exposed, and
   wherein the second base semiconductor die of the second stacked die unit is attached to the first controller chip of the first stacked die unit, and being spaced apart from the first base semiconductor die by a first distance; and a bonding wire directly connecting the second portion of the bonding pads of the first base semiconductor die to the second portion of the bonding pads of the second base semiconductor die.

9. The stacking structure according to claim 8, wherein the second base semiconductor die of the second stacked die unit is attached to the first controller chip of the first stacked die unit through an adhesive layer.

10. The stacking structure according to claim 9, wherein the first distance is equal to a sum of a thickness of the first controller chip and a thickness of the adhesive layer.

11. The stacking structure according to claim 8, wherein the first stacked die unit further comprises first auxiliary bonding chips stacked on the first base semiconductor die adjacent to the first controller chip, and the first auxiliary bonding chips have bonding structures that are hybrid bonded to the bonding pads of the first base semiconductor die; and
the second stacked die unit further comprises second auxiliary bonding chips stacked on the second base semiconductor die adjacent to the second controller chip, and the second auxiliary bonding chips have bonding structures that are hybrid bonded to the bonding pads of the second base semiconductor die.

12. The stacking structure according to claim 8, further comprising an insulating encapsulant encapsulating the first stacked die unit and the second stacked die unit, wherein the insulating encapsulant fills up a space between the first base semiconductor die and the second base semiconductor die defined by the first distance.

13. A method of fabricating a package structure, comprising:
forming a plurality of stacked die units by the following steps:
providing a semiconductor wafer having a plurality of first semiconductor dies, wherein each of the plurality of first semiconductor dies has a plurality of first bonding pads;
stacking a plurality of first bonding chips on the semiconductor wafer, wherein each of the plurality of first bonding chips has a plurality of first bonding structures, wherein the plurality of first bonding structures is bonded to the plurality of first bonding pads in a way that two or more of the plurality of first bonding pads are joined with one of the plurality of first bonding structures through hybrid bonding;
dicing the semiconductor wafer to form the plurality of stacked dies units each comprising one of the first bonding chip stacked over one of the first semiconductor die in a build-up direction;
stacking the plurality of stacked dies units on top of one another in the build-up direction; and
forming an insulating encapsulant encapsulating the plurality of stacked die units.

14. The method of fabricating the package structure according to claim 13, further comprises performing a first thinning step to reduce a thickness of the plurality of first bonding chips.

15. The method of fabricating the package structure according to claim 14, further comprises performing a second thinning step to reduce a thickness of the plurality of first semiconductor dies.

16. The method of fabricating the package structure according to claim 13, further comprises:
providing a semiconductor substrate prior to forming the plurality of stacked die units; and
stacking the plurality of stacked die units on the semiconductor substrate using adhesive layers.

17. The method of fabricating the package structure according to claim 13, further comprises:
providing a carrier and a redistribution layer on the carrier prior to forming the plurality of stacked die units;
stacking the plurality of stacked die units on the redistribution layer using adhesive layers; and
debonding the carrier after forming the insulating encapsulant.

18. The method of fabricating the package structure according to claim 13, further comprises stacking a plurality of second bonding chips on the semiconductor wafer adjacent to the plurality of first bonding chips, wherein each of the plurality of second bonding chips has a plurality of second bonding structures, and the plurality of second bonding structures is connected to the plurality of first bonding pads through hybrid bonding, and the semiconductor wafer is diced so as to form the plurality of stacked dies units each comprising one of the first bonding chip and one of the second bonding chip stacked over one of the first semiconductor die in the build-up direction.

19. The method of fabricating the package structure according to claim 13, further comprises attaching a second semiconductor die having a plurality of second bonding pads to at least one of the plurality of first semiconductor dies using an adhesive layer.

20. The method of fabricating the package structure according to claim 13, further comprises:
providing a plurality of conductive wires electrically connected to at least one of the first bonding pads in each of the plurality of stacked die units; and
forming the insulating encapsulant after providing the plurality of conductive wires.

* * * * *